US010741569B2

(12) United States Patent
Liu et al.

(10) Patent No.: US 10,741,569 B2
(45) Date of Patent: Aug. 11, 2020

(54) SEMICONDUCTOR DEVICE AND MANUFACTURING METHOD THEREOF

(71) Applicant: TAIWAN SEMICONDUCTOR MANUFACTURING CO., LTD., Hsinchu (TW)

(72) Inventors: Chen-Chin Liu, Hsinchu (TW); Wei Cheng Wu, Zhubei (TW); Yi Hsien Lu, Yunlin County (TW); Yu-Hsiung Wang, Zhubei (TW); Juo-Li Yang, Hsinchu (TW)

(73) Assignee: TAIWAN SEMICONDUCTOR MANUFACTURING CO., LTD., Hsinchu (TW)

( * ) Notice: Subject to any disclaimer, the term of this patent is extended or adjusted under 35 U.S.C. 154(b) by 0 days.

(21) Appl. No.: 15/725,000

(22) Filed: Oct. 4, 2017

(65) Prior Publication Data
US 2019/0006380 A1   Jan. 3, 2019

Related U.S. Application Data

(60) Provisional application No. 62/527,815, filed on Jun. 30, 2017.

(51) Int. Cl.
| | | |
|---|---|---|
| *H01L 29/788* | (2006.01) | |
| *H01L 27/11546* | (2017.01) | |
| *H01L 27/088* | (2006.01) | |
| *H01L 21/28* | (2006.01) | |
| *H01L 27/105* | (2006.01) | |
| *H01L 27/11* | (2006.01) | |

(Continued)

(52) U.S. Cl.
CPC .... *H01L 27/11546* (2013.01); *G11C 16/0408* (2013.01); *G11C 16/12* (2013.01);
(Continued)

(58) Field of Classification Search
CPC . H01L 27/11546; H01L 21/28; H01L 27/088; H01L 27/105; H01L 27/11;
(Continued)

(56) References Cited

U.S. PATENT DOCUMENTS

| | | |
|---|---|---|
| 2004/0056319 A1 | 3/2004 | Kuo et al. |
| 2006/0134864 A1 | 6/2006 | Higashitani et al. |

(Continued)

FOREIGN PATENT DOCUMENTS

| | | |
|---|---|---|
| CN | 102117774 A | 7/2011 |
| CN | 102956690 A | 3/2013 |

(Continued)

OTHER PUBLICATIONS

Notice of Allowance issued in related Korean Patent Application No. 10-2017-0167648, dated Sep. 19, 2019.

*Primary Examiner* — Matthew C Landau
*Assistant Examiner* — Dmitriy Yemelyanov
(74) *Attorney, Agent, or Firm* — McDermott Will & Emery LLP

(57) ABSTRACT

In a method of manufacturing a semiconductor device, a memory cell structure covered by a protective layer is formed in a memory cell area of a substrate. A mask pattern is formed. The mask pattern has an opening over a first circuit area, while the memory cell area and a second circuit area are covered by the mask pattern. The substrate in the first circuit area is recessed, while the memory cell area and the second circuit area are protected. A first field effect transistor (FET) having a first gate dielectric layer is formed in the first circuit area over the recessed substrate and a second FET having a second gate dielectric layer is formed in the second circuit area over the substrate as viewed in cross section.

20 Claims, 19 Drawing Sheets

(51) Int. Cl.
  *G11C 16/12* (2006.01)
  *G11C 16/04* (2006.01)
  *H01L 27/092* (2006.01)
  *H01L 21/8238* (2006.01)
  *H01L 27/11548* (2017.01)
  *H01L 29/423* (2006.01)

(52) U.S. Cl.
  CPC .................. *H01L 21/28008* (2013.01); *H01L 21/823857* (2013.01); *H01L 27/0883* (2013.01); *H01L 27/0922* (2013.01); *H01L 27/1052* (2013.01); *H01L 27/1108* (2013.01); *H01L 27/11548* (2013.01); *H01L 29/788* (2013.01); *H01L 29/42328* (2013.01)

(58) Field of Classification Search
  CPC ..... H01L 29/423; H01L 29/788; G11C 16/04; G11C 16/12
  See application file for complete search history.

(56) References Cited

U.S. PATENT DOCUMENTS

| | | | |
|---|---|---|---|
| 2007/0293029 A1* | 12/2007 | Ogawa | H01L 21/823462 438/585 |
| 2009/0101909 A1* | 4/2009 | Chen | H01L 31/035281 257/65 |
| 2009/0315099 A1 | 12/2009 | Park et al. | |
| 2011/0020992 A1 | 1/2011 | Purayath et al. | |
| 2013/0082318 A1 | 4/2013 | Liu et al. | |
| 2014/0374814 A1* | 12/2014 | Wu | H01L 27/11568 257/326 |
| 2015/0263010 A1 | 9/2015 | Chuang et al. | |
| 2016/0093633 A1* | 3/2016 | Toba | H01L 27/11546 257/314 |
| 2016/0148944 A1* | 5/2016 | Yu | H01L 27/11536 438/258 |
| 2016/0181261 A1 | 6/2016 | Wu et al. | |
| 2016/0211250 A1 | 7/2016 | Langheinrich et al. | |
| 2016/0247856 A1 | 8/2016 | Song et al. | |
| 2016/0284697 A1 | 9/2016 | Yoon et al. | |
| 2017/0186762 A1 | 6/2017 | Pan et al. | |

FOREIGN PATENT DOCUMENTS

| | | |
|---|---|---|
| CN | 104241291 A | 12/2014 |
| JP | 2011-222938 A | 11/2011 |
| KR | 10-0267772 B1 | 10/2000 |
| KR | 2001-0108658 A | 12/2001 |
| TW | 200509230 A | 3/2005 |
| TW | 201125044 A | 7/2011 |
| TW | 201436109 A | 9/2014 |

* cited by examiner

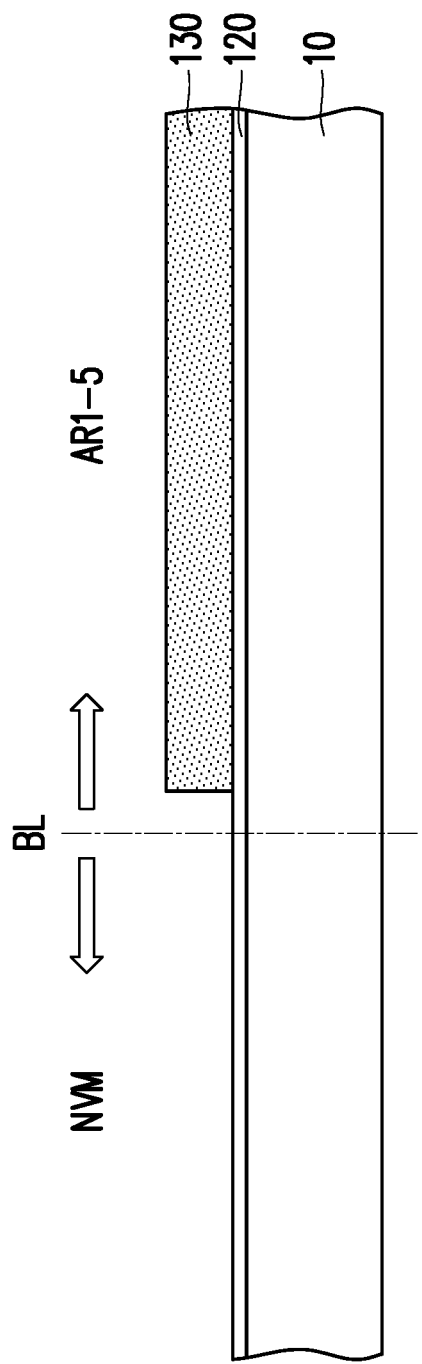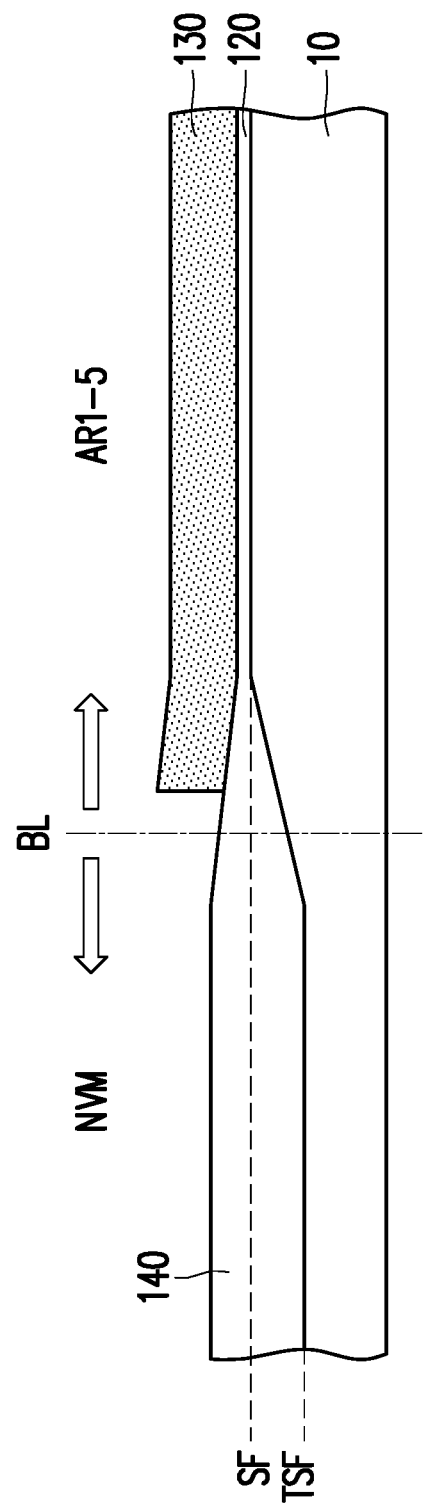

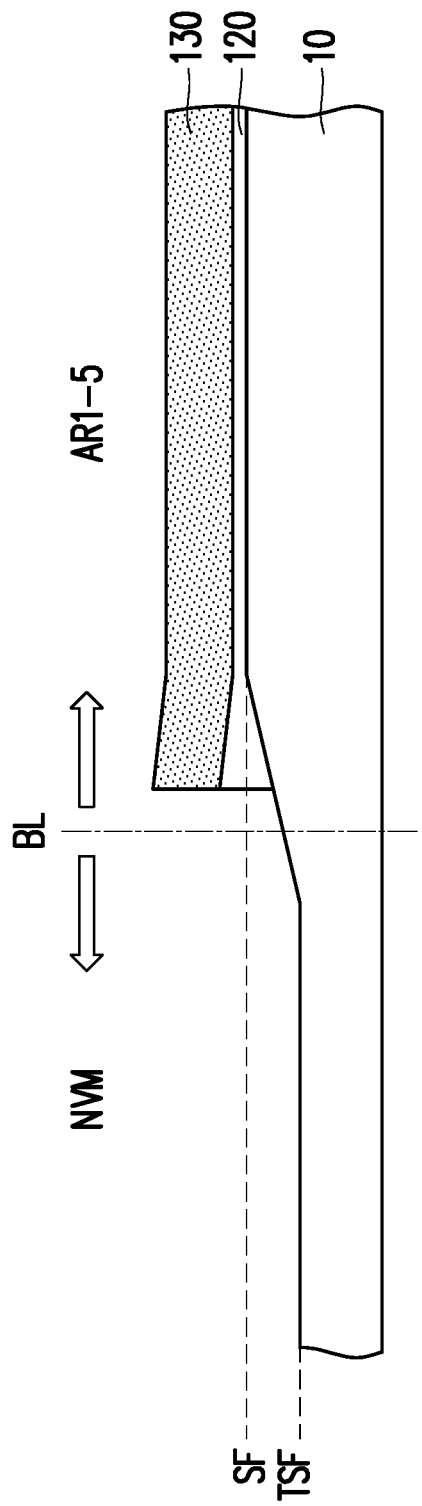
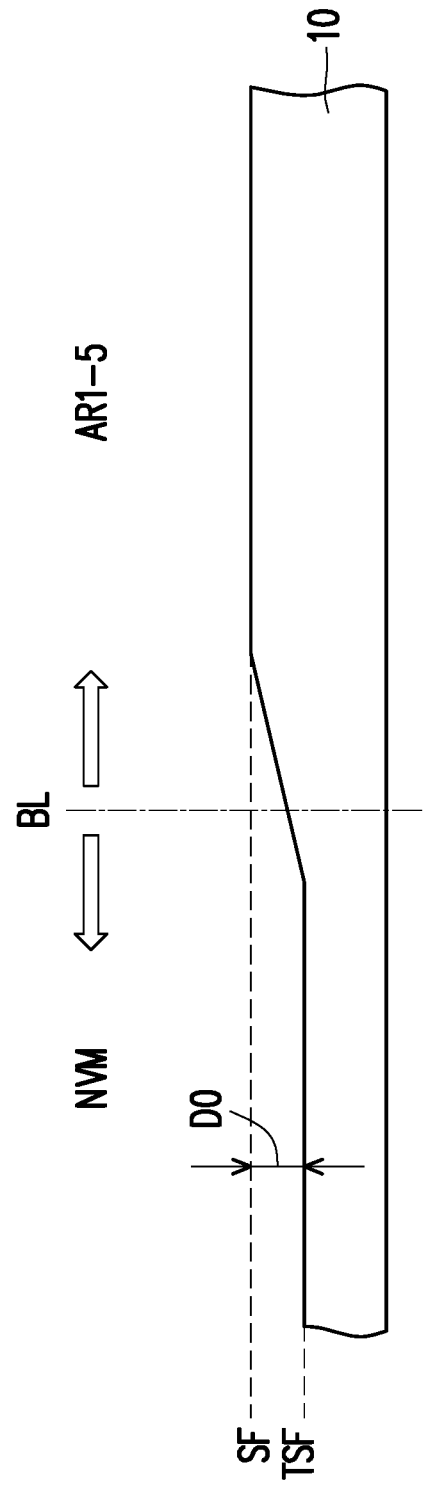

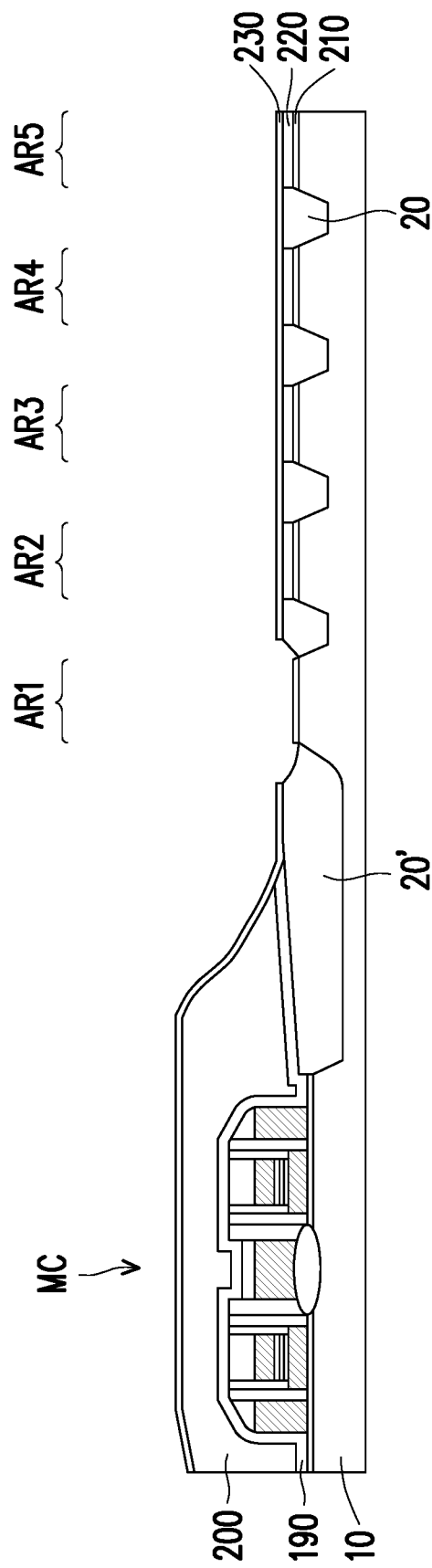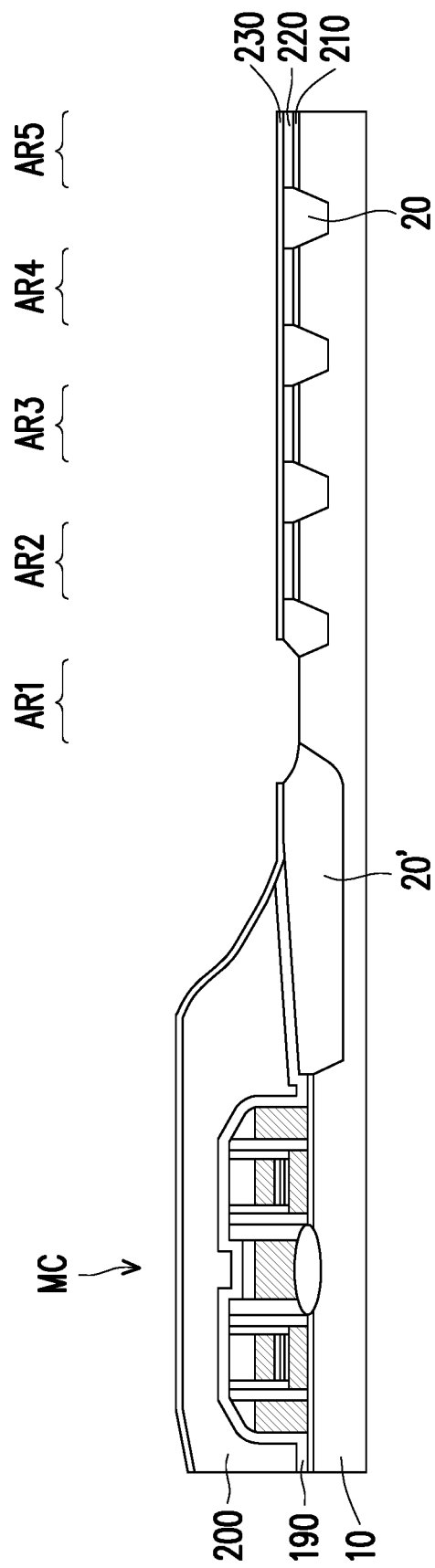

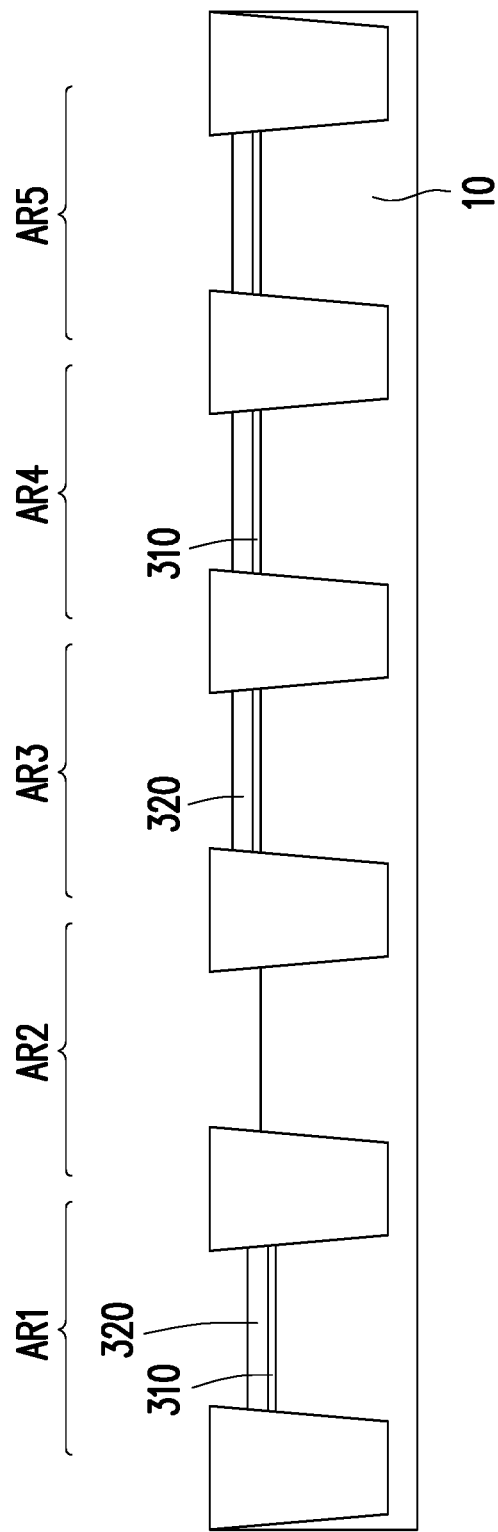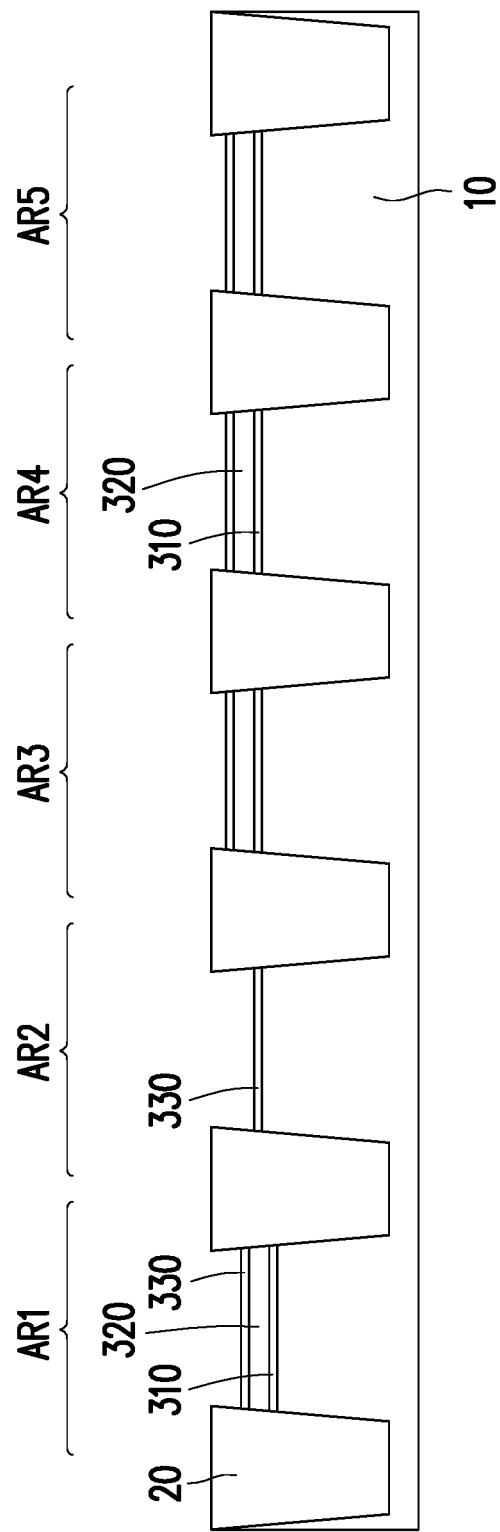

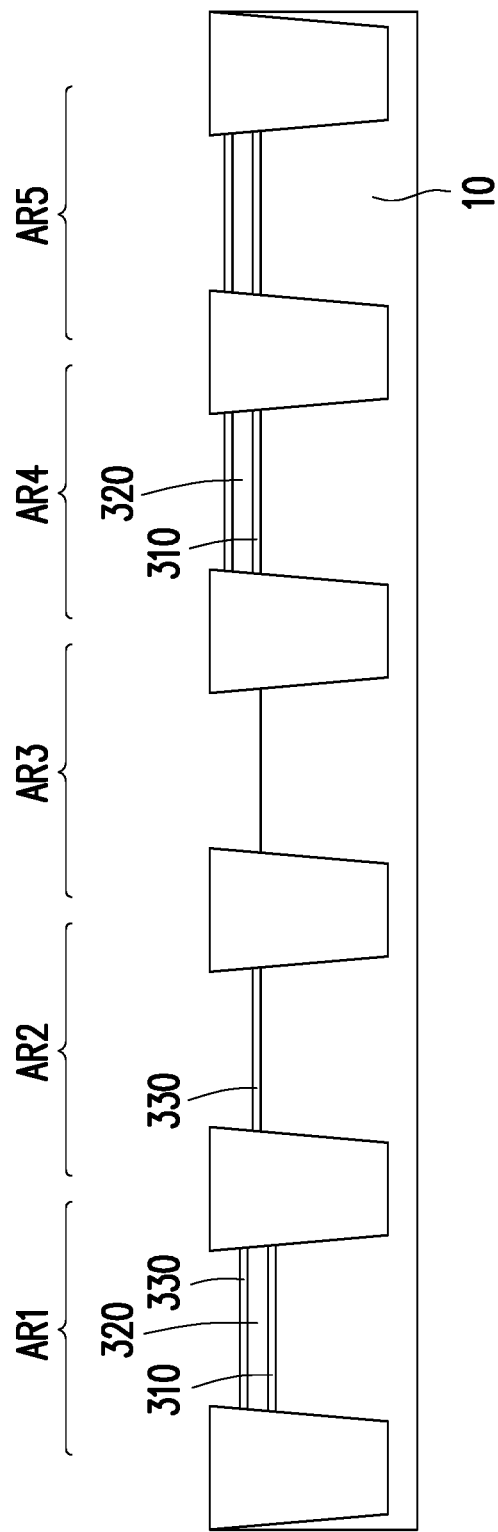
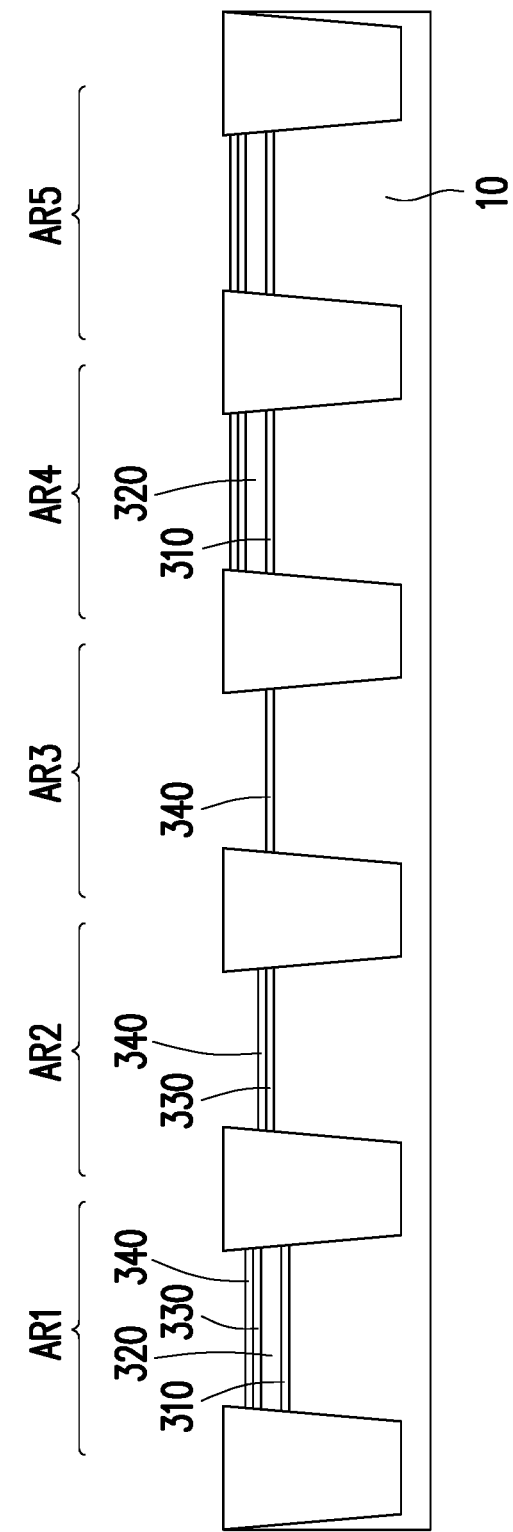

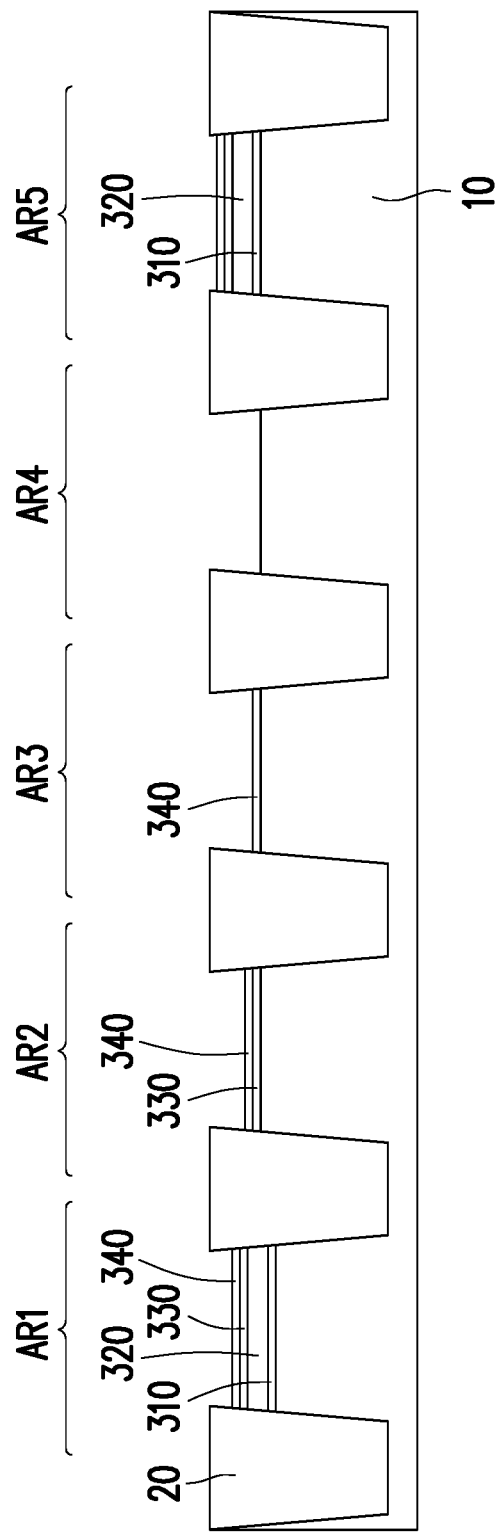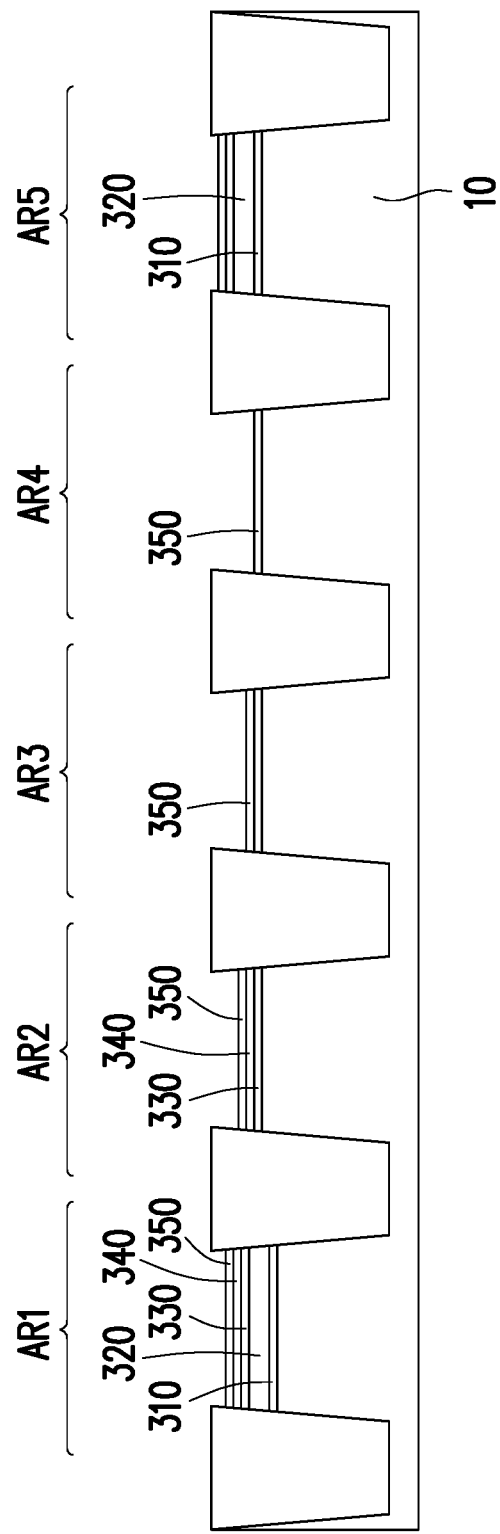

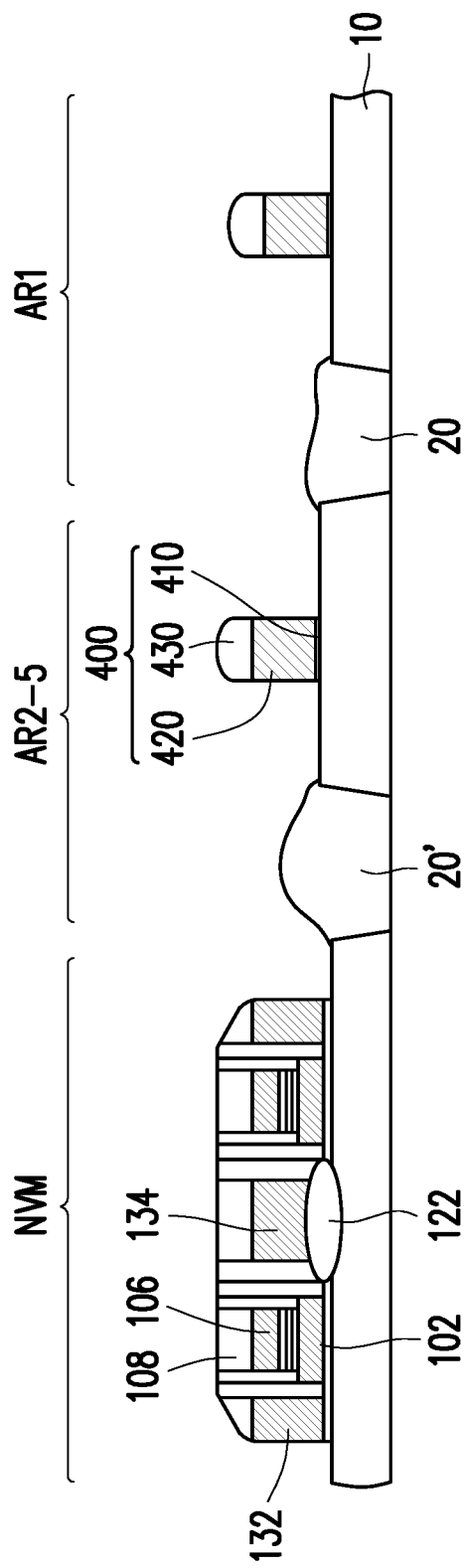
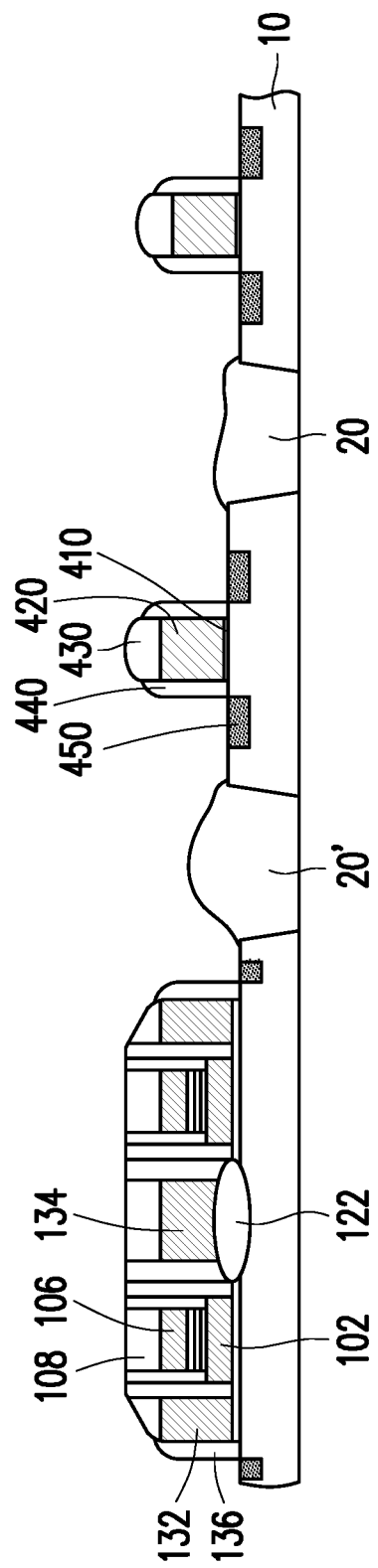
FIG. 26
FIG. 27

SEMICONDUCTOR DEVICE AND MANUFACTURING METHOD THEREOF

This application claims a priority of U.S. Provisional Application No. 62/527,815 filed Jun. 30, 2017, the entire contents of which are incorporated herein by reference.

TECHNICAL FIELD

The disclosure relates to semiconductor integrated circuits, more particularly to semiconductor devices including non-volatile memory cells and peripheral devices, and manufacturing processes thereof.

BACKGROUND

As the semiconductor industry has progressed into nanometer technology process nodes in pursuit of higher device density, higher performance, and lower costs, there have been challenges in controlling flatness of an underlying layer in view of lithography operations. In particular, chemical mechanical polishing operations have played an important role for planarizing the underlying layer.

BRIEF DESCRIPTION OF THE DRAWINGS

The present disclosure is best understood from the following detailed description when read with the accompanying figures. It is emphasized that, in accordance with the standard practice in the industry, various features are not drawn to scale and are used for illustration purposes only. In fact, the dimensions of the various features may be arbitrarily increased or reduced for clarity of discussion.

FIG. 2A shows a cross sectional view illustrating one of various stages of a sequential manufacturing process for forming a step between the NVM area and the circuit areas according to embodiments of the present disclosure. FIG. 2B shows a cross sectional view illustrating one of various stages of a sequential manufacturing process for forming a step between the NVM area and the circuit areas according to embodiments of the present disclosure. FIG. 2C shows a cross sectional view illustrating one of various stages of a sequential manufacturing process for forming a step between the NVM area and the circuit areas according to embodiments of the present disclosure. FIG. 2D shows a cross sectional view illustrating one of various stages of a sequential manufacturing process for forming a step between the NVM area and the circuit areas according to embodiments of the present disclosure.

FIG. 8 shows a cross sectional view illustrating one of various stages of a sequential process for manufacturing a semiconductor device including the NVM area and the circuit areas according to embodiments of the present disclosure.

FIG. 9 shows a cross sectional view illustrating one of various stages of a sequential process for manufacturing a semiconductor device including the NVM area and the circuit areas according to embodiments of the present disclosure.

FIG. 16 shows a cross sectional view illustrating one of various stages of forming gate dielectric layers for the circuit areas according to embodiments of the present disclosure.

FIG. 17 shows a cross sectional view illustrating one of various stages of forming gate dielectric layers for the circuit areas according to embodiments of the present disclosure.

FIG. 18 shows a cross sectional view illustrating one of various stages of forming gate dielectric layers for the circuit areas according to embodiments of the present disclosure.

FIG. 19 shows a cross sectional view illustrating one of various stages of forming gate dielectric layers for the circuit areas according to embodiments of the present disclosure.

FIG. 20 shows a cross sectional view illustrating one of various stages of forming gate dielectric layers for the circuit areas according to embodiments of the present disclosure.

FIG. 21 shows a cross sectional view illustrating one of various stages of forming gate dielectric layers for the circuit areas according to embodiments of the present disclosure.

FIG. 26 shows a cross sectional view illustrating one of various stages of forming a transistor structure for the circuit areas according to embodiments of the present disclosure.

FIG. 27 shows a cross sectional view illustrating one of various stages of forming a transistor structure for the circuit areas according to embodiments of the present disclosure.

DETAILED DESCRIPTION

Figure 1:
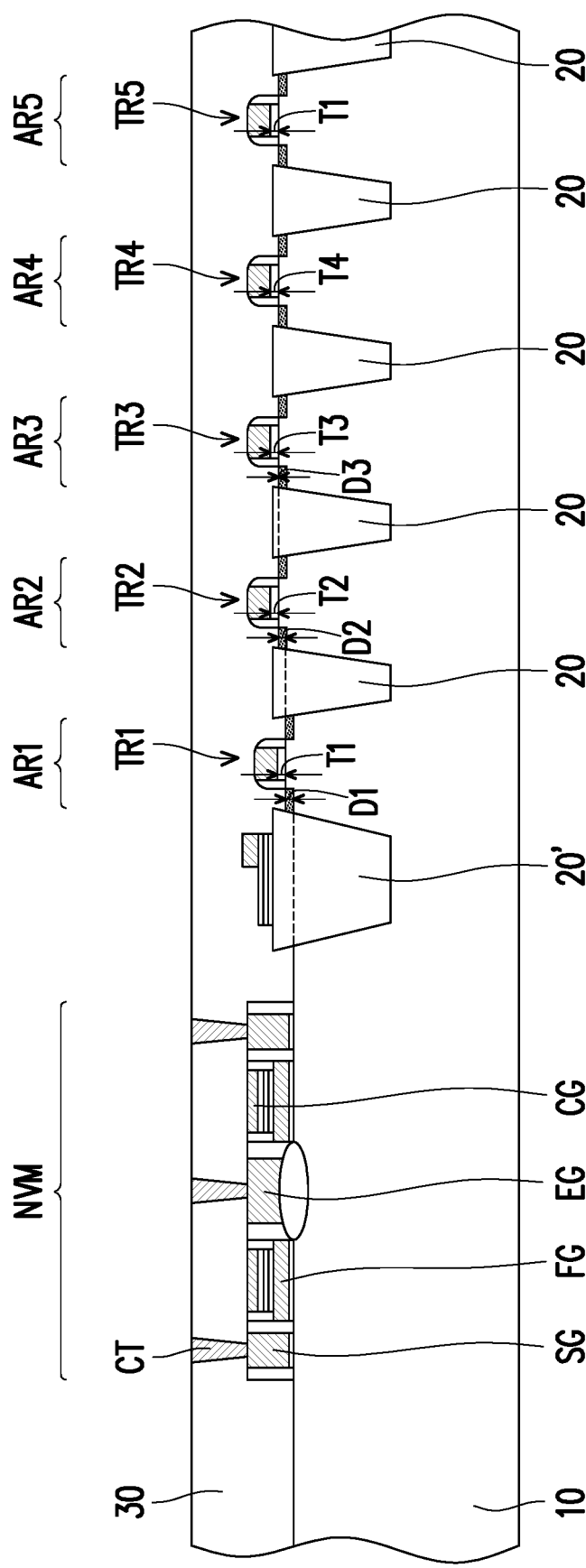
FIG. 1 shows a cross sectional view of a semiconductor device including a non-volatile memory (NVM) area and circuit areas of various operation voltages according to embodiments of the present disclosure.

It is to be understood that the following disclosure provides many different embodiments, or examples, for implementing different features of the invention. Specific embodiments or examples of components and arrangements are described below to simplify the present disclosure. These are, of course, merely examples and are not intended to be limiting. For example, dimensions of elements are not limited to the disclosed range or values, but may depend upon process conditions and/or desired properties of the device. Moreover, the formation of a first feature over or on a second feature in the description that follows may include embodiments in which the first and second features are formed in direct contact, and may also include embodiments in which additional features may be formed interposing the first and second features, such that the first and second features may not be in direct contact. Various features may be arbitrarily drawn in different scales for simplicity and clarity.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The device may be otherwise oriented (rotated 90 degrees or at other orientations) and the spatially relative descriptors used herein may likewise be interpreted accordingly. In addition, the term "made of" may mean either "comprising" or "consisting of." In the present disclosure, a phrase "one of A, B and C" means "A, B and/or C" (A, B, C, A and B, A and C, B and C, or A, B and C), and does not mean one element from A, one element from B and one element from C, unless otherwise described.

In the present embodiment, a semiconductor device includes non-volatile memory (NVM) cells and peripheral circuits (e.g., drivers, decoders, I/O circuits and/or logic circuits). The NVM cells generally require a stacked structure in which plural layers, such as polysilicon layers, are stacked, while the peripheral circuits generally include field effect transistors (FETs) having a height smaller than the NVM cells. Because of the structure differences, when, for example, a conductive material layer for a gate structure and/or an interlayer dielectric (ILD) layer are formed over the NVM cells and the peripheral circuits, there is a height difference in the ILD layer between an NVM cell area and a peripheral circuit area. Such a height difference may affect the performance of CMP on the conductive material layer and/or the ILD layer.

In the present disclosure, before fabricating the NVM cells and the peripheral devices, a substrate in the NVM cell area is etched to make a "step" between the NVM cell area and the peripheral device area. The step height corresponds to the height difference when the ILD layer is formed if the step is otherwise not formed. Further, it is also noted that placement of devices should be avoided near the step.

In addition, the peripheral circuits include various FETs operating at different voltages. For example, the peripheral circuits include a high-voltage (HV) circuit (FET) operating at, for example, 5 V or more. Such a HV circuit generally requires a thick gate dielectric layer, while other circuits may require a thinner gate dielectric layer. Such a thickness differences in the gate dielectric layers also affect the performance of CMP.

FIG. 1 shows a cross sectional view of a semiconductor device including a non-volatile memory (NVM) area and circuit areas of various operating voltages according to embodiments of the present disclosure.

The semiconductor device includes an NVM area NVM and first to fifth peripheral circuit areas AR1-AR5 disposed on a substrate 10, as shown in FIG. 1. Each area is isolated by isolation insulating layer 20, such as shallow trench isolation (STI), from the adjacent area. The first circuit area AR1 is for a HV circuit, which operates at the highest voltage V1 among the circuits in the first to fifth circuit areas AR1-AR5. The HV circuit is utilized to perform an erase operation for the NVM cells. In some embodiments, the operational voltage for the HV circuit is more than about 5 V (absolute value) and may be the highest in the semiconductor device. In certain embodiments, the operational voltage for the HV circuit is in a range from about 7 V to 15 V (absolute value). The thickness (T1) of the gate dielectric layer of FETs TR1 for the HV circuits in the first area AR1 is largest. Although FIG. 1 illustrates one FET in each area AR1-AR5, each area includes more than one FET constituting circuitry.

The second circuit area AR2 is for an analog circuit in some embodiments, which operates at the second highest voltage V2 (V1>V2) among the circuits in the first to fifth circuit areas AR1-AR5. In some embodiments, the operational voltage for the analog circuit is about 5 V. The thickness (T2) of the gate dielectric layer of FETs TR2 for the analog circuits in the second area AR2 is second largest (T1>T2).

The third circuit area AR3 is for an I/O circuit in some embodiments, which operates at the third highest voltage V3 (V1>V2>V3) among the circuits in the first to fifth circuit areas AR1-AR5. In some embodiments, the operational voltage for the analog circuit is equal to or more than about 3 V and less than 5 V. The thickness (T3) of the gate dielectric layer of FETs TR3 for the I/O circuits in the third area AR3 is third largest (T1>T2>T3).

The fourth circuit area AR4 is for a word line (WL) driver circuit in some embodiments, which operates at the fourth highest voltage V4 (V1>V2>V3>V4) among the circuits in the first to fifth circuit areas AR1-AR5. In some embodiments, the operational voltage for the WL driver circuit is equal to or more than about 1 V and less than 3.3 V. The thickness (T4) of the gate dielectric layer of FETs TR4 for the WL driver circuits in the fourth area AR4 is fourth largest (T1>T2>T3>T4).

The fifth circuit area AR5 is for a core logic circuit in some embodiments, which operates at the lowest voltage V5 (V1>V2>V3>V4>V5) among the circuits in the first to fifth circuit areas AR1-AR5. In some embodiments, the operational voltage for the core logic circuit is equal to or more than about 0.5 V and less than 1.5 V. The thickness (T5) of the gate dielectric layer of FETs TR5 for the core logic circuits in the fifth area AR4 is smallest (T1>T2>T3>T4>T5). In some embodiments, the fifth circuit area AR5 includes a static random access memory (SRAM).

In other embodiments, V1 is equal to V2, V2 is equal to V3, V3 is equal to V4 and/or V4 is equal to V5 (but not more than two voltages are equal to each other) and/or T1 is equal to T2, T2 is equal to T3, T3 is equal to T4 and/or T4 is equal to T5 (but not more than two thicknesses are equal to each other).

In the NVM area, a plurality of NVM cells are disposed and a pair of NVM cells is shown in FIG. 1. The NVM cells include a floating gate FG, a control gate CG, a select gate SG and an erase gate EG. One or more contacts CT are also disposed passing through the first ILD layer 30.

As shown in FIG. 1, the upper surface of the substrate 10 in the NVM area NVM is lower than the upper surface of the first area AR1 of the substrate 10 by a distance D1, and the upper surface of the first area AR1 of the substrate 10 is lower than the upper surfaces of the second to fifth areas AR2-AR5 of the substrate 10 by a distance D2. The upper surface of the NVM area (memory cell forming surface) is defined as the interface between a dielectric layer (e.g., ILD layer) in direct contact with the substrate and the substrate in the NVM area, and the upper surfaces of the first to fifth areas (device forming surface) are defined as the interface between a dielectric layer (e.g., ILD layer) in direct contact with the substrate and the substrate. In other embodiments, a step is formed between the second area AR2 and the third area AR3. Because of these "steps" between the areas, it is possible to reduce height differences caused by the different stacked structure and/or gate dielectric thicknesses. In the present disclosure, "upper" and "lower" are used to define a relative position along the Z direction (the normal direction of the substrate), and the "upper" level is farther from the substrate than the "lower" level. In other words, the "lower" level is closer to the backside of the substrate than the "upper" level.

In some embodiments, D1 is in a range from about 10 nm to about 100 nm and D2 is in a range from about 5 nm to about 50 nm. In other embodiments, D1 is in a range from about 15 nm to about 50 nm and D2 is in a range from about 10 nm to about 30 nm. If a step is formed between the second area AR2 and the third area AR3, the step difference D3 is in a range from about 2 nm to about 20 nm in some embodiments.

FIGS. 2A-2D show cross sectional views illustrating various stages of a sequential manufacturing process for forming a step between the NVM area and the circuit areas according to embodiments of the present disclosure. It is understood that additional operations can be provided before, during, and after processes shown by FIGS. 2A-2D, and some of the operations described below can be replaced or eliminated, for additional embodiments of the method. The order of the operations may be changed.

As shown in FIG. 2A, a silicon nitride layer 130 is formed over a silicon oxide layer 120 formed on the substrate 10, and the silicon nitride layer 130 is patterned by using a photo-etching operation. Then, as shown in FIG. 2B, the NVM cell area NVM is thermally oxidized by using wet oxidation, thereby forming an oxide layer 140 (so-called, "LOCOS"). As shown in FIG. 2C, the oxide layer 140 is removed by wet etching, and then the silicon nitride layer 130, the silicon oxide layer 120 and the bird's beak portion are removed. Thus, the step having a height D0 is formed between the NVM cell area NVM and the peripheral circuit areas AR1-AR5. The step height D0 is defined by the difference between the original surface SF and the etched surface TSF, as shown in FIGS. 2B-2D. The step height D0 is in a range from about 10 nm to about 150 nm in some embodiments.

In some embodiments, the substrate 10 is silicon, the silicon oxide layer 120 is thermally grown silicon oxide, and the nitride layer 130 is silicon nitride formed by chemical vapor deposition (CVD). The substrate 10 may be SiGe, SiC, or a group III-V semiconductor. The thickness of the silicon oxide layer 120 is in a range from about 5 nm to about 20 nm and the thickness of the silicon nitride layer 130 is in a range from about 50 nm to about 100 nm in some embodiments.

The step can be formed by one or more etching operations disclosed by U.S. patent application Ser. No. 15/267,954 filed on Sep. 16, 2016, the entire contents of which are incorporated herein by reference.

After the "step" is formed as shown in FIG. 2D, the NVM cells in the NVM cell area NVM are fabricated. The fabrication operations of the non-volatile memory cells according to some embodiments are described in U.S. patent application Ser. No. 15/209,370 filed on Jul. 13, 2016, the entire contents of which are incorporated herein by reference.

After the "step" is formed, isolation insulating layers (STIs) 20 are formed. To form the isolation insulating layers 20, a mask layer including a silicon oxide layer and a silicon nitride layer is formed on the substrate 10, and the mask layer is patterned by lithography and etching operations. Then, by using the patterned mask layer as an etching mask, the substrate 10 is trench-etched to form trenches. A depth of the trenches is in a range from about 100 nm to about 1 μm in some embodiments.

Figure 3A:
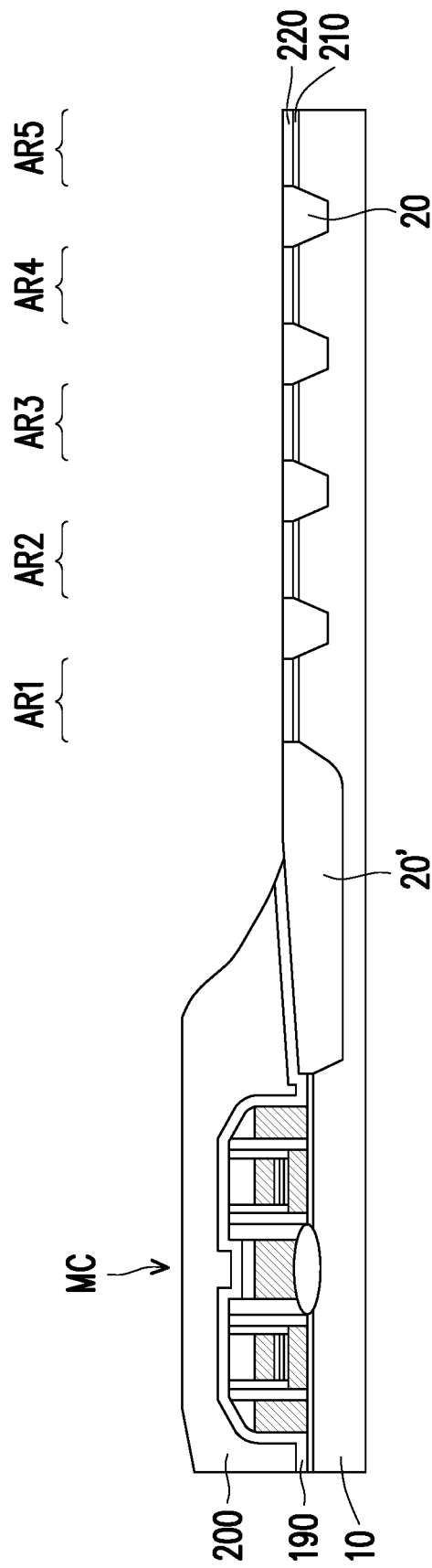
FIG. 3A shows a cross sectional view illustrating one of various stages of a sequential process for manufacturing a semiconductor device including the NVM area and the circuit areas according to embodiments of the present disclosure.
Figure 3B:
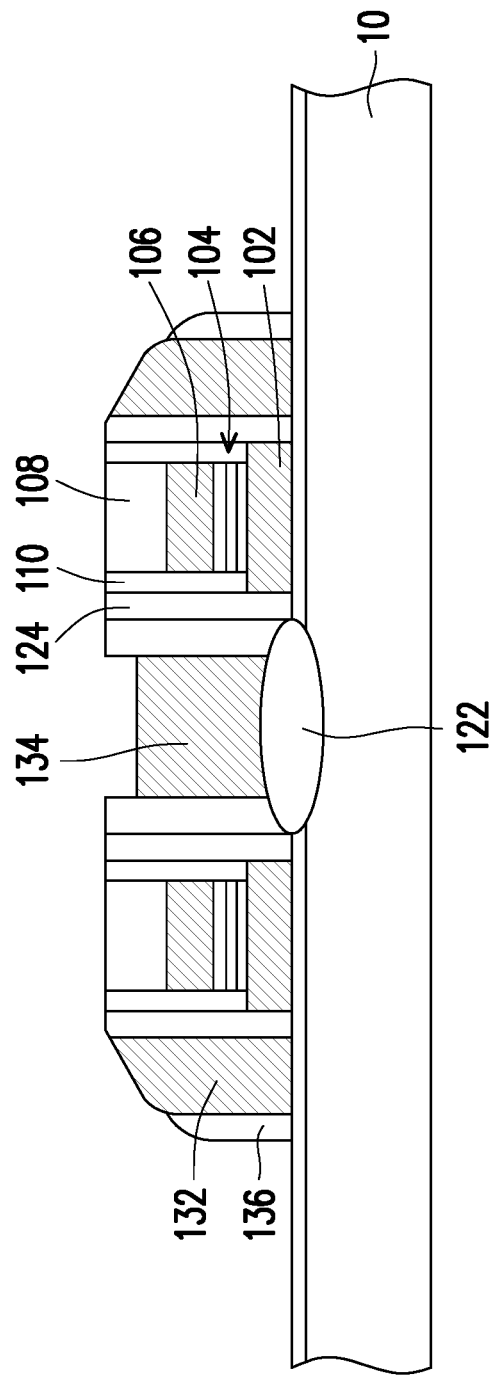
FIG. 3B shows a cross sectional view of an NVM cell structure.

The trenches are filled with an insulating (dielectric) material, and then, a planarization operation, such as CMP or an etch-back process, is performed so as to remove an upper part of the insulating material layer, thereby forming the isolation layers 20. The substrate not etched, and surrounded or separated by the STI in plan view is an active region, over which transistors or other semiconductor devices are formed. As shown in FIG. 3A, the NVM cell area NVM and the peripheral logic circuit areas AR1-AR5 are separated by a large isolation layer 20'. After the isolation layers 20 are formed, the NVM cell structures MC are formed in the cell area NVM, as shown in FIGS. 3A and 3B.

FIGS. 3A-12 show cross sectional views illustrating various stages of a sequential process for manufacturing a semiconductor device including the NVM area and the circuit areas according to embodiments of the present disclosure. It is understood that additional operations can be provided before, during, and after processes shown by FIGS. 3A-12, and some of the operations described below can be replaced or eliminated, for additional embodiments of the method. The order of the operations may be changed.

To fabricate the NVM cells, a tunnel dielectric layer is formed over the substrate and the first polysilicon layer is formed over the tunnel dielectric layer. The first polysilicon layer is patterned by suitable patterning operations, thereby forming floating gate patterns (FG patterns) 102. A width of the FG pattern 102 is in a range from about 80 nm to about 120 nm and a thickness of the FG pattern 102 is in a range from about 20 nm to about 70 nm in some embodiments.

After the FG pattern 102 is formed, a stacked layer of a first insulating layer stack 104, a second polysilicon layer 106 and a second insulating layer 108 are formed over the FG pattern 102. The first insulating layer stack 104 includes one or more layers of a silicon oxide layer and a silicon nitride layer, each having thicknesses of about 30-50 nm or about 50-90 nm in some embodiments. The thickness of the second polysilicon layer 106 is in a range from about 45 nm to about 70 nm in some embodiments.

The second insulating layer 108 is silicon nitride having a thickness of about 50 nm to about 200 nm in some embodiments. In certain embodiments, the second insulating layer has a stacked structure of a silicon nitride layer having a thickness of about 5 nm to about 10 nm, a silicon oxide layer having a thickness of about 50 nm to 100 nm, and a silicon nitride layer having a thickness of about 20 nm to about 1000 nm. These layers can be formed by CVD or atomic layer deposition (ALD). Subsequently, the stacked layer is patterned in some embodiments by using lithography and etching operations, thereby forming a gate stack structure including the first insulating layer 104, a control gate (CG) 106 and a nitride cap 108, as shown in FIG. 3B.

Further, first sidewall spacers (CG spacers) 110 are formed on both main side faces of the stacked gate structure, as shown in FIG. 3B. The first sidewall spacers 110 are made of, for example, one or more layers of SiN, $SiO_2$ and SiON, and have a thickness in a range from about 10 nm to about 40 nm in some embodiments.

Further, an erase gate oxide layer 122 is formed between two gate stack structures, and second sidewall spacers (FG spacers) 124 made of silicon oxide are formed as shown in FIG. 3B. The second sidewall spacers 124 are made of, for example, one or more layers of SiN, $SiO_2$ and SiON, which may be the same or different from the first sidewall spacers 110, and have a thickness in a range from about 10 nm to about 40 nm in some embodiments.

Subsequently, word lines (select gates SG) 132 and an erase gate (EG) 134 are formed as shown in FIG. 3B. The word lines 132 and erase gate 134 are made of a conductive material, such as doped polysilicon. A thickness of the word lines 132 and erase gate 134 is in a range from about 50 nm to about 140 nm in some embodiments. Further, third sidewall spaces (WL spacers) 136 are formed on sidewalls of the word lines 132, as shown in FIG. 3B.

Figure 4:
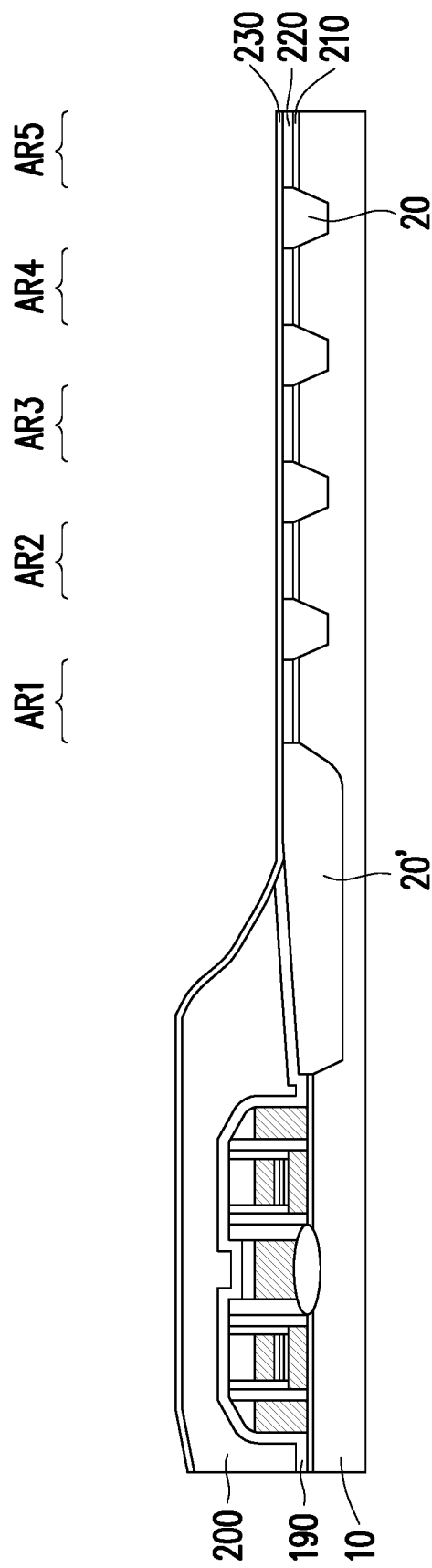
FIG. 4 shows a cross sectional view illustrating one of various stages of a sequential process for manufacturing a semiconductor device including the NVM area and the circuit areas according to embodiments of the present disclosure.

After the NVM cell structure MC is formed, one or more cover layers 200 is formed over the NVM cell structure MC, as shown in FIG. 3A. The cover layer 200 is made of polysilicon in some embodiments. Before forming the polysilicon cover layer 200, a dielectric layer 190 (as shown in FIG. 4), such as a silicon oxide layer, is formed over the NVM cell structure MC by using CVD. After the cover layer 200 is formed, a first silicon oxide layer 210 is formed in the peripheral logic circuit areas AR1-AR5, and then a nitride layer 220 is formed on the first silicon oxide layer 210, as shown in FIG. 3A.

In some embodiments, the first silicon oxide layer 210 is thermally grown silicon oxide, and the nitride layer 220 is silicon nitride or silicon oxynitride formed by chemical vapor deposition (CVD). The thickness of the first silicon oxide layer 210 is in a range from about 5 nm to about 20 nm and the thickness of the silicon nitride layer 220 is in a range from about 50 nm to about 100 nm in some embodiments.

Further, as shown in FIG. 4, a second silicon oxide layer 230 is formed on the silicon nitride layer 220. The second silicon oxide layer 230 can be formed by CVD or ALD and have a thickness in a range from about 5 nm to about 20 nm in some embodiments. The second silicon oxide layer 230 may be a resist protect oxide (RPO) layer, which can protect areas which should not be damaged by an etching or a removal process.

Figure 5:
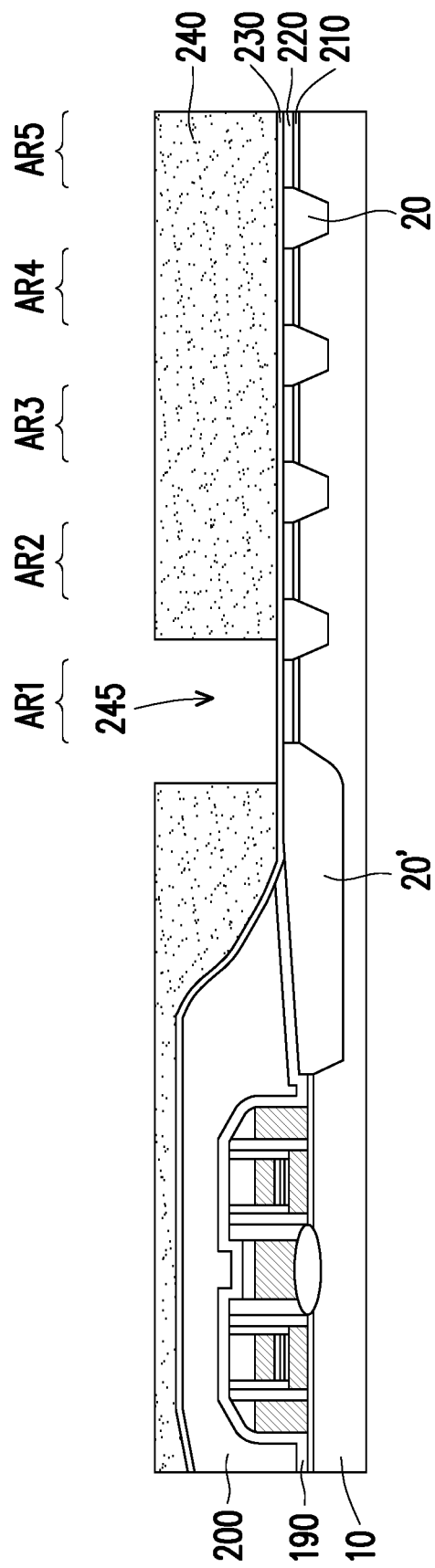
FIG. 5 shows a cross sectional view illustrating one of various stages of a sequential process for manufacturing a semiconductor device including the NVM area and the circuit areas according to embodiments of the present disclosure.
Figure 6:
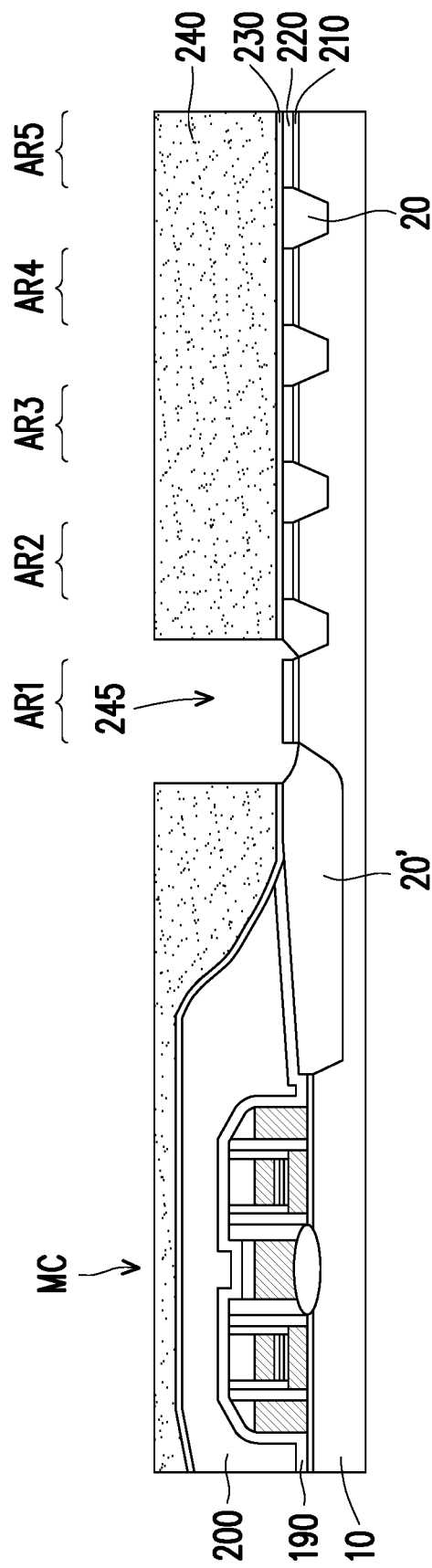
FIG. 6 shows a cross sectional view illustrating one of various stages of a sequential process for manufacturing a semiconductor device including the NVM area and the circuit areas according to embodiments of the present disclosure.

Next, as shown in FIG. 5, a resist pattern 240 having an opening pattern 245 is formed on the second silicon oxide layer 230. The opening pattern 245 exposes the first logic circuit area AR1. In other embodiments, the opening pattern exposes the first and second logic circuit areas AR1 and AR2.

Figure 7:
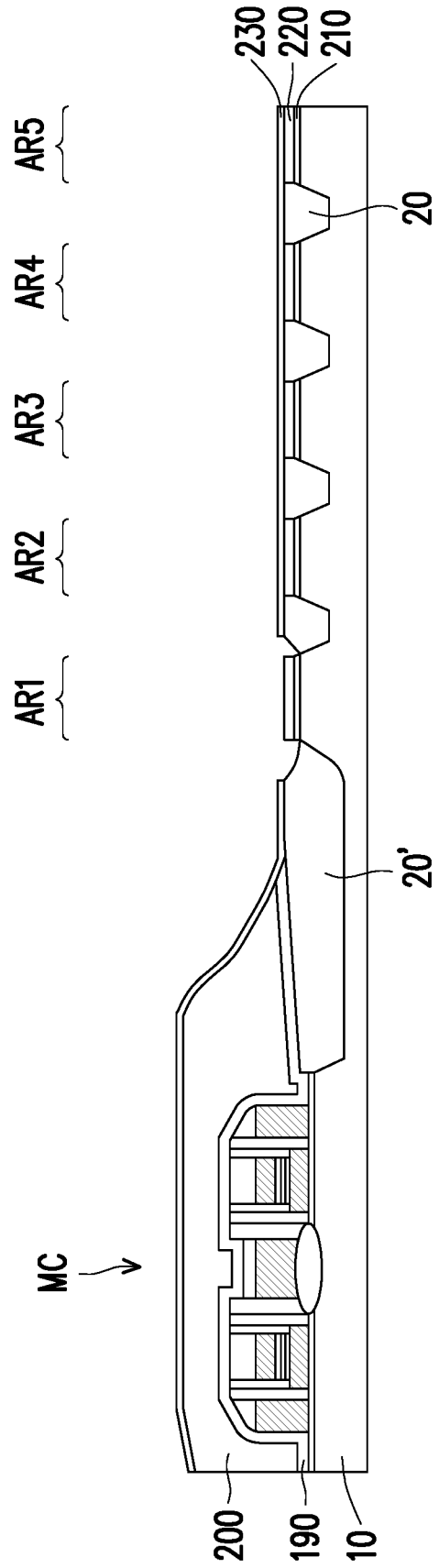
FIG. 7 shows a cross sectional view illustrating one of various stages of a sequential process for manufacturing a semiconductor device including the NVM area and the circuit areas according to embodiments of the present disclosure.

By using the resist pattern 240 as an etching mask, the second silicon oxide layer 230 in the first area AR1 is removed by using wet etching. By this etching, part of the isolation insulating layers 20, 20' is also removed. Then, as shown in FIG. 7, the photo resist layer 240 is removed.

Subsequently, as shown in FIG. 8, the exposed silicon nitride layer 220 in logic circuit area AR1 is removed by using wet etching. $H_3PO_4$ may be used as an etchant of the wet etching. Then, as shown in FIG. 9, the exposed first silicon oxide layer 210 in the logic circuit area AR1 is removed by wet etching.

Figure 10:
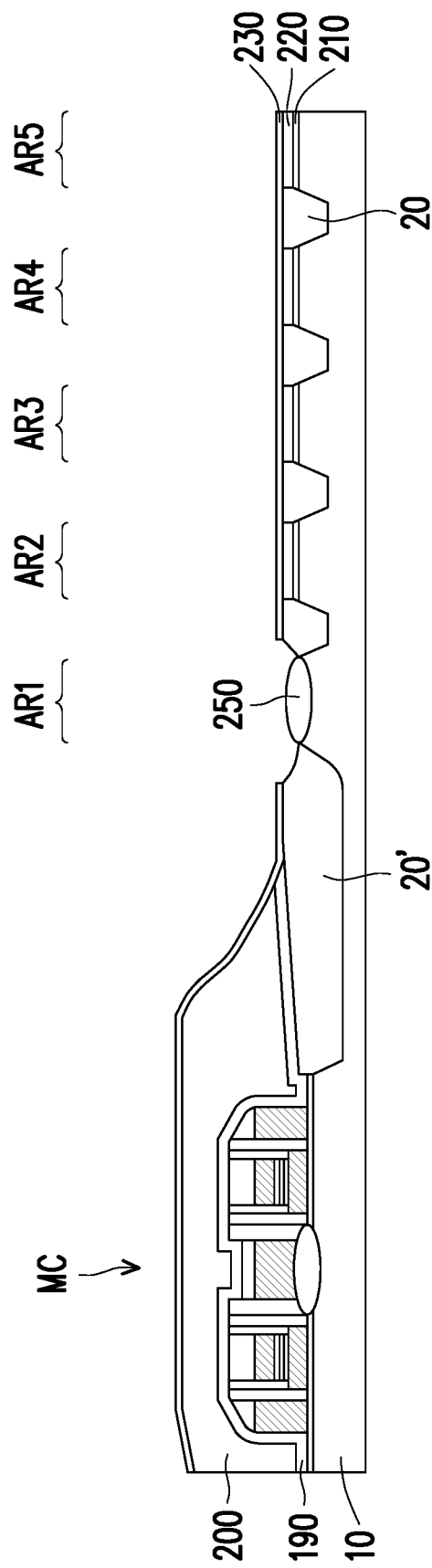
FIG. 10 shows a cross sectional view illustrating one of various stages of a sequential process for manufacturing a semiconductor device including the NVM area and the circuit areas according to embodiments of the present disclosure.
Figure 11:
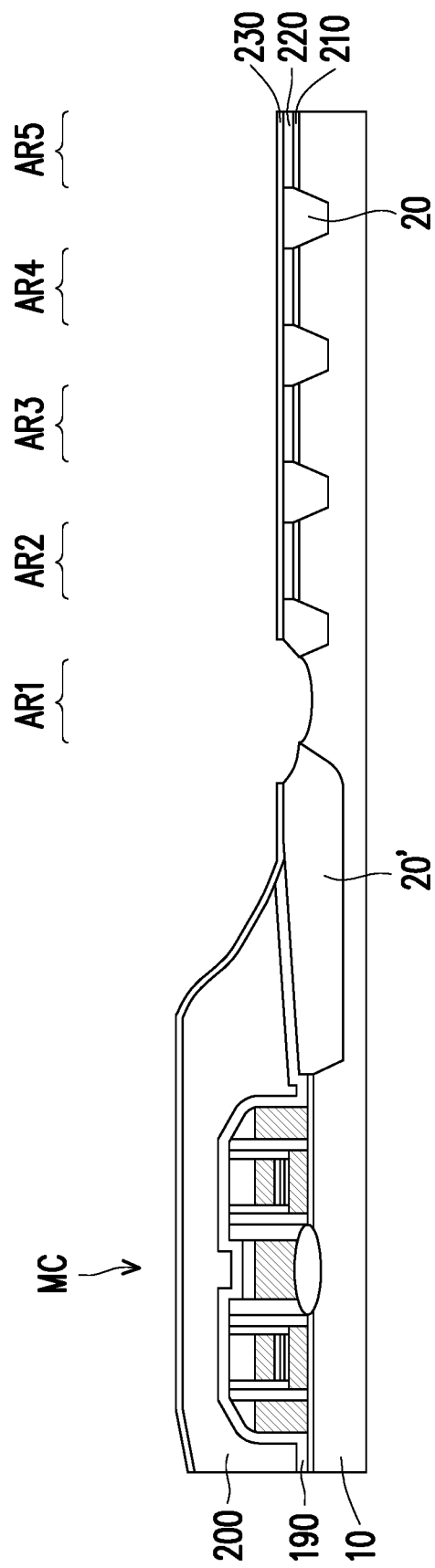
FIG. 11 shows a cross sectional view illustrating one of various stages of a sequential process for manufacturing a semiconductor device including the NVM area and the circuit areas according to embodiments of the present disclosure.

Thereafter, a third silicon oxide layer 250 is formed in the first area AR1, as shown in FIG. 10. The third silicon oxide layer 250 can be formed by a wet oxidation method, and have a thickness of about 5 nm to about 100 nm in some embodiments. Further, as shown in FIG. 11, the third silicon oxide layer 250 is removed by wet etching. By this etching, the third silicon oxide layer 250 may be fully removed or partially removed.

Figure 12:
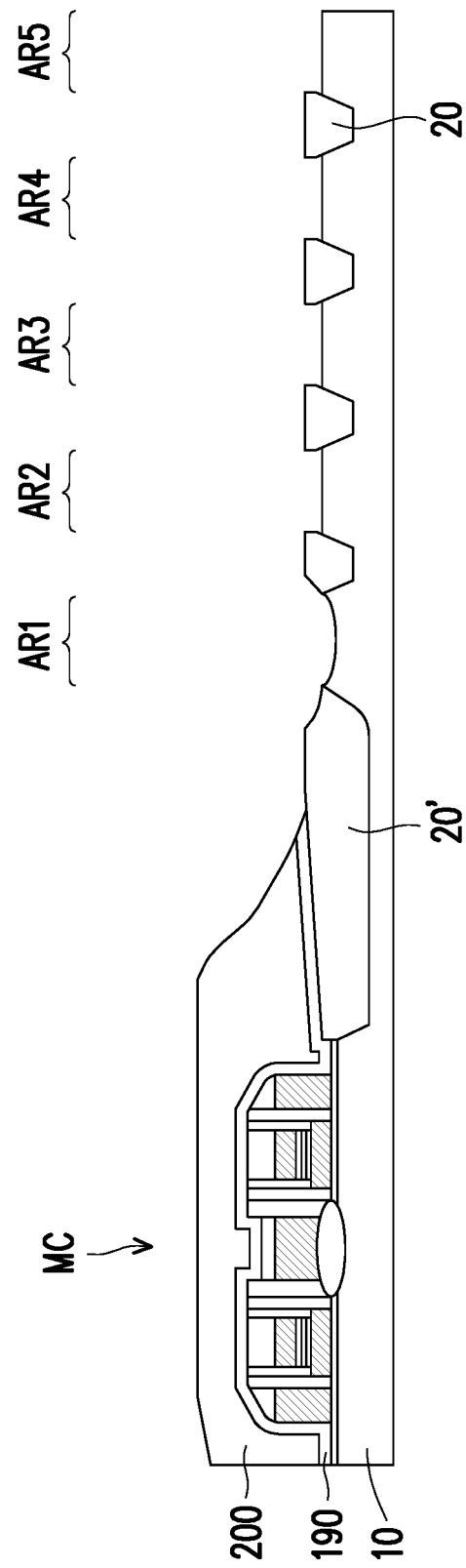
FIG. 12 shows a cross sectional view illustrating one of various stages of a sequential process for manufacturing a semiconductor device including the NVM area and the circuit areas according to embodiments of the present disclosure.

Then, as shown in FIG. 12, the second silicon oxide layer 230, the silicon nitride layer 220, the first silicon oxide layer 210 and any remaining third silicon oxide layer 250, if exists, are removed. As shown in FIG. 12, the step between the first area AR1 and the second to fifth areas AR2-AR5 is formed. In some embodiments, the first silicon oxide layer 210 is not removed and remains on the substrate 10. In other embodiments, the substrate 10 for the first area AR1 is directly etched by one or more etching operations.

Figure 13:
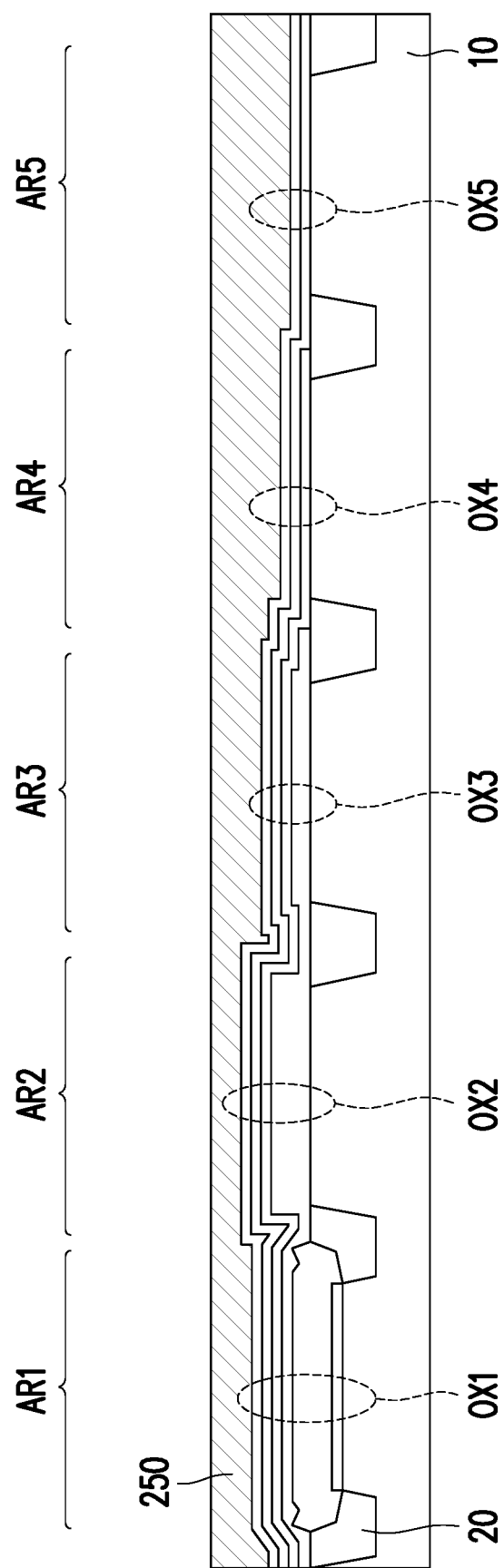
FIG. 13 shows a cross sectional view illustrating one of various stages of a sequential process for manufacturing a semiconductor device including the NVM area and the circuit areas according to embodiments of the present disclosure.

FIG. 13 shows a cross sectional view illustrating the circuit areas according to embodiments of the present disclosure. In FIG. 13, gate dielectric layers OX1-OX5 having various thicknesses are formed in the first to fifth areas AR1-AR5. Although FIG. 13 illustrates a gate dielectric layer having different layers, when the materials of the adjacent layer are the same (e.g., silicon oxide), there is no interface between the adjacent layers. In other words, two or more layers are observed as one layer.

In some embodiments, a conductive layer 250 for gate electrodes is formed over the gate dielectric layers as shown in FIG. 13. The conductive layer 250 includes one or more layers of metal material, such as Al, Cu, Ti and/or TiN, or a polysilicon. Further, the conductive layer 250 is planarized by CMP. Since the first area AR1 is recessed as set forth above, the difference in the thickness between the first area AR1 and the other areas can be reduced, even though the first area AR1 has the thickest gate dielectric layer OX1.

FIGS. 14-23 show cross sectional views illustrating various stages of forming gate dielectric layers for the peripheral circuit areas according to embodiments of the present disclosure. It is understood that additional operations can be provided before, during, and after processes shown by FIGS. 14-23, and some of the operations described below can be replaced or eliminated, for additional embodiments of the method. The order of the operations may be changed.

Figure 14:
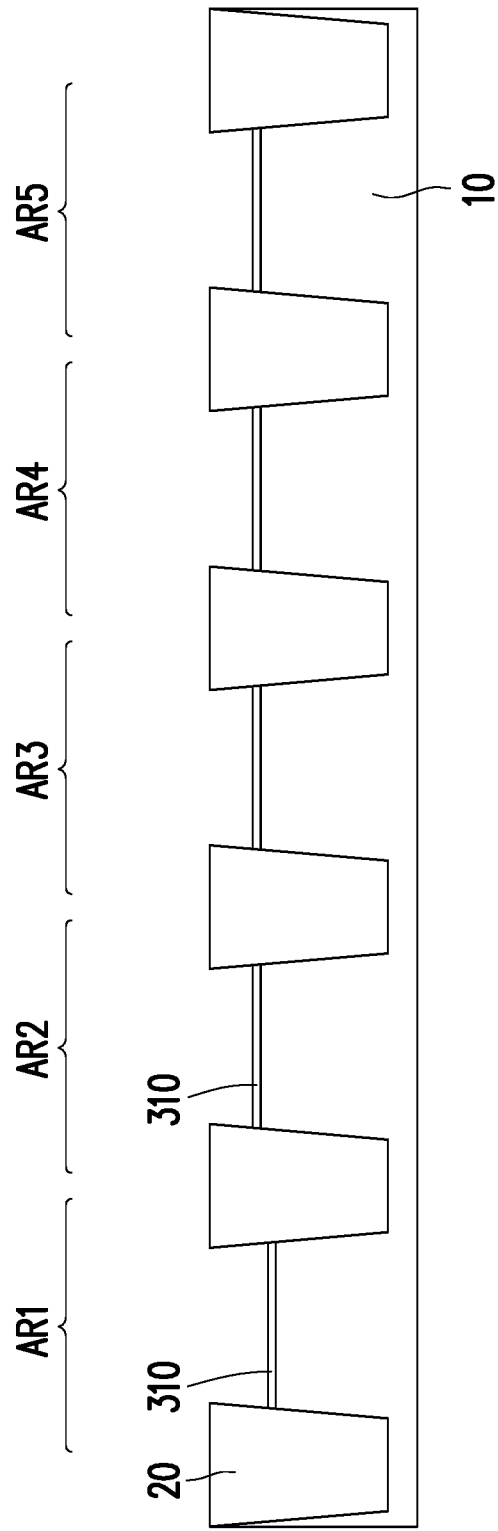
FIG. 14 shows a cross sectional view illustrating one of various stages of forming gate dielectric layers for the circuit areas according to embodiments of the present disclosure.

As shown in FIG. 14, a first dielectric layer 310 is formed on the surface of active regions of the substrate 10 surrounded by the isolation insulating layers 20, respectively. The first dielectric layer 310 is thermally grown silicon oxide in some embodiments. In other embodiments, the first dielectric layer 310 can be the first silicon oxide layer 210, which has not been removed. The thickness (T11) of the first dielectric layer 310 is in a range from about 5 nm to about 20 nm in some embodiments.

Figure 15:
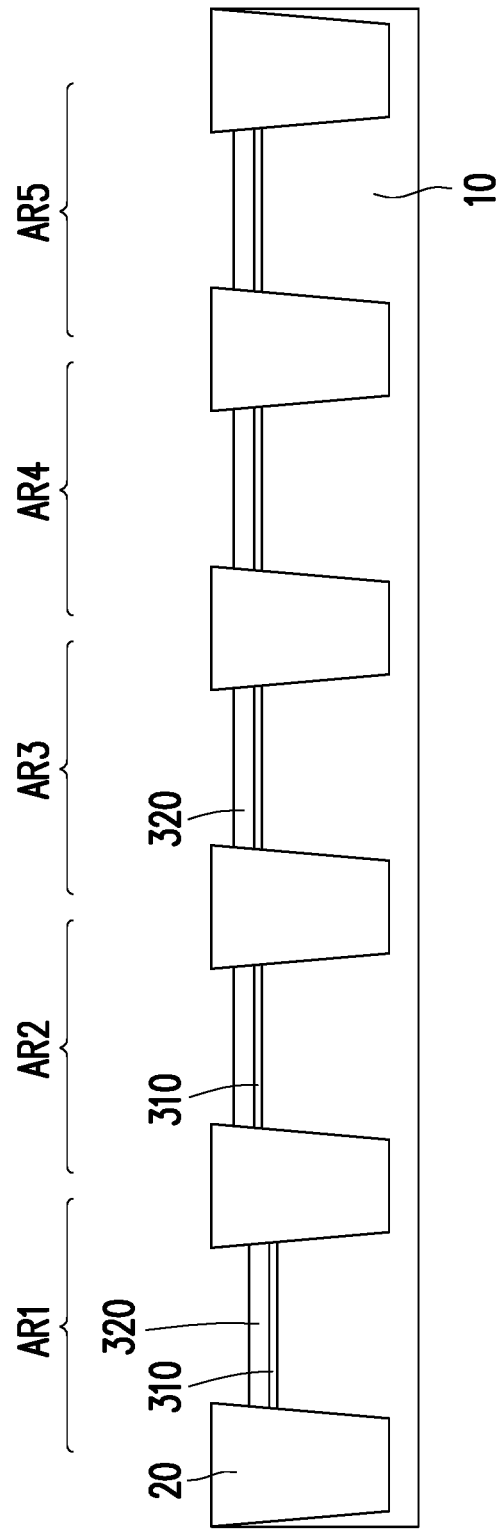
FIG. 15 shows a cross sectional view illustrating one of various stages of forming gate dielectric layers for the circuit areas according to embodiments of the present disclosure.

A second dielectric layer 320 is formed on the first dielectric layer 310 as shown in FIG. 15. The second dielectric layer 320 is thermally grown silicon oxide in some embodiments. In other embodiments, the second dielectric layer 320 is one or more layers of silicon oxide, silicon oxynitride, hafnium oxide or zinc oxide formed by CVD or ALD. The thickness (T12) of the second dielectric layer 320 is in a range from about 10 nm to about 15 nm in some embodiments.

Then, by using lithography and etching operations, the first and second dielectric layers 310 and 320 in the second area AR2 are removed, as shown in FIG. 16. A third dielectric layer 330 is formed on the second dielectric layer 320 and on the substrate of the second area AR2, as shown in FIG. 17. The third dielectric layer 330 is thermally grown silicon oxide, by using a furnace, a rapid thermal oxidation method or a chemical oxidation method, in some embodiments. In other embodiments, the third dielectric layer 330 is silicon oxide formed by CVD or ALD. The thickness (T13) of the third dielectric layer 330 is in a range from about 8 nm to about 13 nm in some embodiments. The third dielectric layer 330 may not be formed on the second dielectric layer 320 in some embodiments.

Then, by using lithography and etching operations, the first to third dielectric layers in the third area AR3 are removed, as shown in FIG. 18. A fourth dielectric layer 340 is formed on the third dielectric layer 330 and on the substrate of the third area AR3, as shown in FIG. 19. The fourth dielectric layer 340 is thermally grown silicon oxide, by using a furnace, a rapid thermal oxidation method or a chemical oxidation method, in some embodiments. In other embodiments, the fourth dielectric layer 340 is silicon oxide formed by CVD or ALD. The thickness (T14) of the fourth dielectric layer 340 is in a range from about 3 nm to about 8 nm in some embodiments. The fourth dielectric layer 340 is not formed on the second dielectric layer 320 in some embodiments.

Then, by using lithography and etching operations, the first to fourth dielectric layers in the fourth area AR4 are removed, as shown in FIG. 20. A fifth dielectric layer 350 is formed on the fourth dielectric layer 340 and on the substrate of the fourth area AR4, as shown in FIG. 21. The fifth dielectric layer 350 is thermally grown silicon oxide, by using a furnace, a rapid thermal oxidation method or a chemical oxidation method, in some embodiments. In other embodiments, the fifth dielectric layer 350 is silicon oxide formed by CVD or ALD. The thickness (T15) of the fifth dielectric layer 350 is in a range from about 2 nm to about 3 nm in some embodiments. The fifth dielectric layer 350 is not formed on the second dielectric layer 320 in some embodiments.

Figure 22:
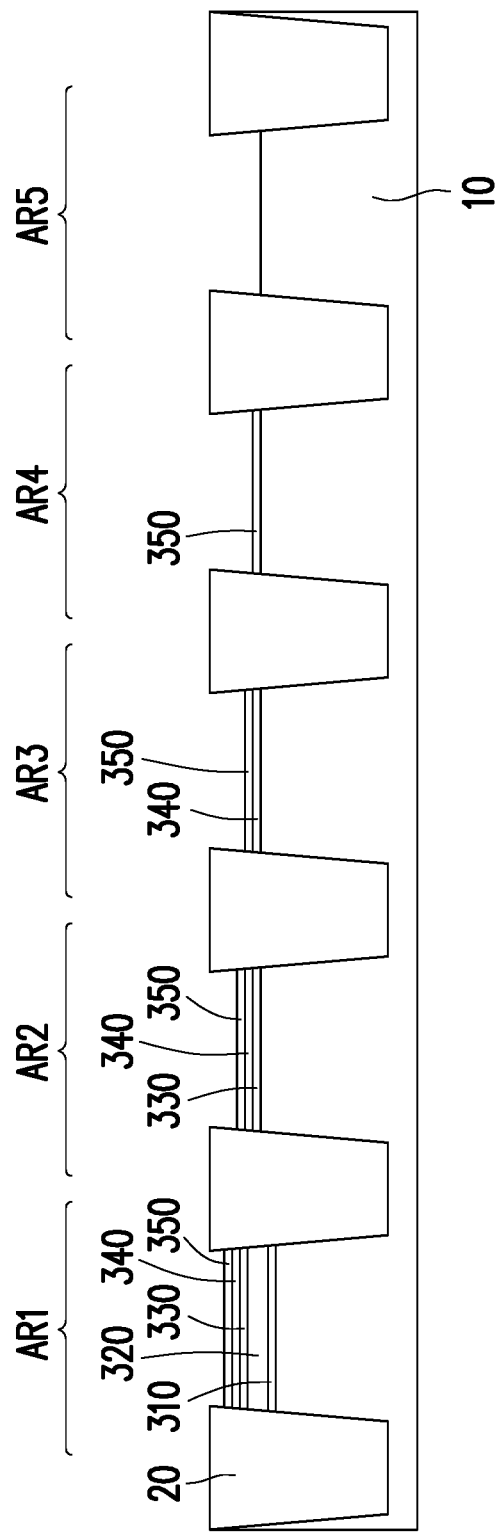
FIG. 22 shows a cross sectional view illustrating one of various stages of forming gate dielectric layers for the circuit areas according to embodiments of the present disclosure.
Figure 23:
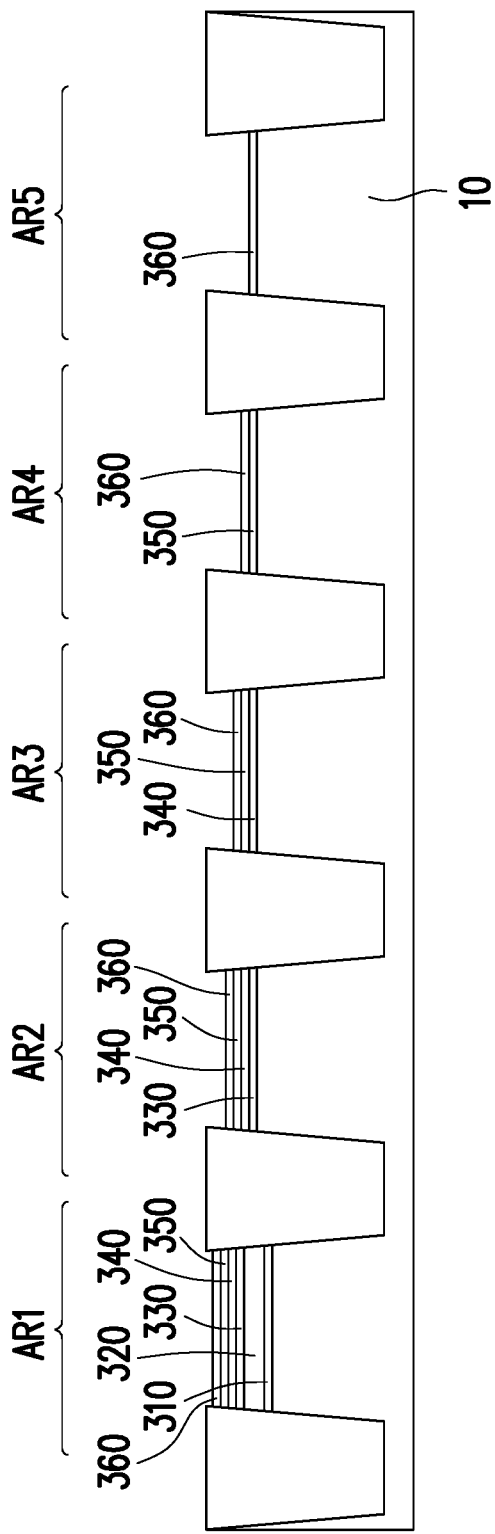
FIG. 23 shows a cross sectional view illustrating one of various stages of forming gate dielectric layers for the circuit areas according to embodiments of the present disclosure.

Further, by using lithography and etching operations, the first to fifth dielectric layers in the fifth area AR5 are removed, as shown in FIG. 22. A sixth dielectric layer 360 is formed on the fifth dielectric layer 350 and on the substrate of the fifth area AR5, as shown in FIG. 23. The sixth dielectric layer 360 is thermally grown silicon oxide, by using a furnace, a rapid thermal oxidation method or a chemical oxidation method, in some embodiments. In other embodiments, the sixth dielectric layer 360 is silicon oxide or silicon oxynitride formed by CVD or ALD. In some embodiments, the sixth dielectric layer 360 is high-k dielectric layer formed by CVD or ALD. Examples of high-k dielectric materials include oxides of Li, Be, Mg, Ca, Sr, Sc, Y, Zr, Hf, Al, La, Ce, Pr, Nd, Sm, Eu, Gd, Tb, Dy, Ho, Er, Tm, Yb, Lu, and/or mixtures thereof. When a high-k dielectric layer is used, an interfacial silicon oxide layer formed by chemical oxide may be used before forming the high-k dielectric layer 360. The thickness (T16) of the sixth dielectric layer 360 is in a range from about 1 nm to about 2 nm in some embodiments.

In FIGS. 14-23, the first to sixth dielectric layers are distinctively illustrated for explanation purposes. However, when the materials of the adjacent layer are the same (e.g., silicon oxide), there is no interface between the adjacent layers. In other words, two or more layers are observed as one layer. In addition, when a gate dielectric layer is formed by a deposition method, a newly formed layer is formed on the existing layer, and when a gate dielectric layer is formed by an oxidation method, the thickness of the existing oxide layer increases. In such a case, a gate oxide layer formed by an oxidation method on the existing oxide layer is thinner than a gate oxide layer formed on the surface of the substrate (e.g., Si). Further, formation of the dielectric layer(s) over the isolation insulating layers 20 is also omitted for simplicity.

As set forth above, the total thickness of the gate dielectric layer OX1 of the first area AR1 is in a range from about 25 nm to about 60 nm, the total thickness of the gate dielectric layer OX2 of the second area AR2 is in a range from about 13 nm to about 25 nm, the total thickness of the gate dielectric layer OX3 of the third area AR3 is in a range from about 6 nm to about 13 nm, and the total thickness of the gate dielectric layer OX4 of the fourth area AR4 is in a range from about 3 nm to about 5 nm, in some embodiments.

FIGS. 24-29 show cross sectional views illustrating various stages of forming a transistor structure for the circuit areas according to embodiments of the present disclosure.

Figure 24:
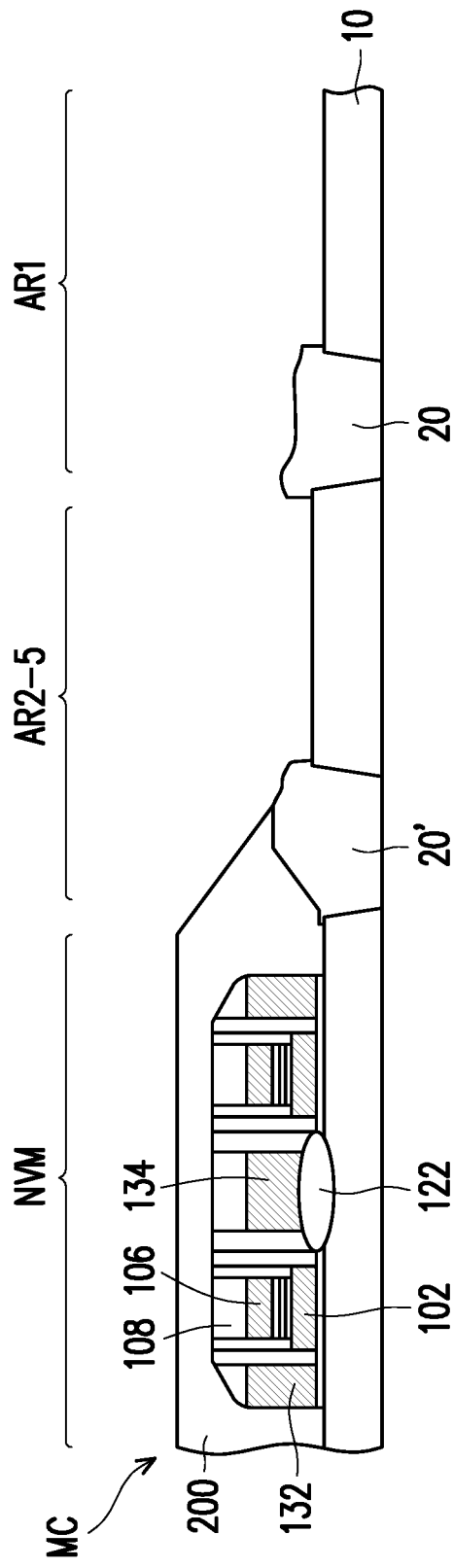
FIG. 24 shows a cross sectional view illustrating one of various stages of forming a transistor structure for the circuit areas according to embodiments of the present disclosure.

FIG. 24 is substantially equivalent to FIG. 12. In FIG. 12, the first area AR1 for a HV circuit is disposed between the NVM area NVM and the second to fifth areas AR2-AR5, while in FIG. 24, one or more of the second to fifth areas AR2-AR5 are disposed between the NVM area NVM and the first area AR1.

Figure 25:
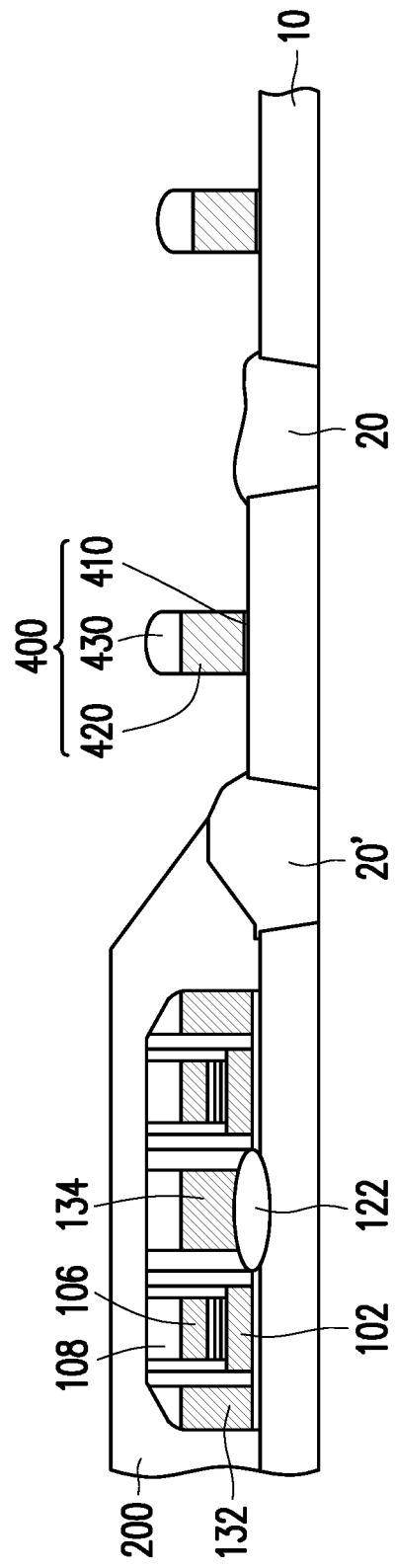
FIG. 25 shows a cross sectional view illustrating one of various stages of forming a transistor structure for the circuit areas according to embodiments of the present disclosure.

After the gate dielectric layers OX1-OX5 are formed as shown in FIG. 22, a polysilicon layer is formed over the structure of FIG. 22, and a hard mask layer including one or more of a silicon oxide layer or a silicon nitride layer is formed on the polysilicon layer. By using lithography and etching operations, dummy gate structures 400 are formed as shown in FIG. 25. The dummy gate structures 400 include a gate dielectric layer 410 (OX1-OX5), a dummy gate 420 and a cap layer 430.

Figure 28:
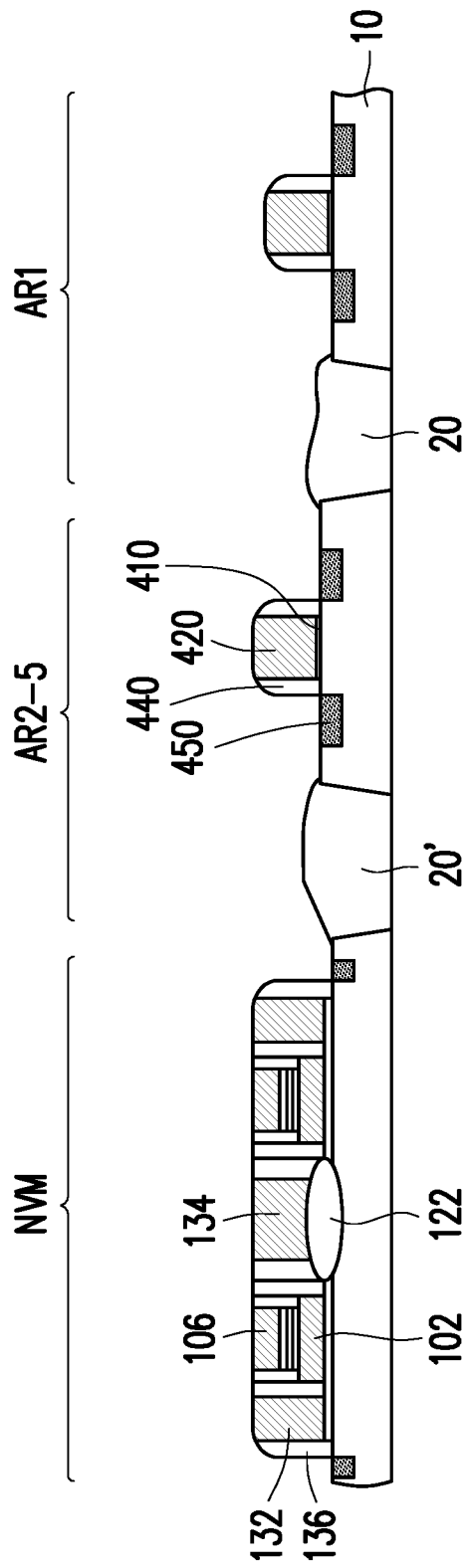
FIG. 28 shows a cross sectional view illustrating one of various stages of forming a transistor structure for the circuit areas according to embodiments of the present disclosure.
Figure 29:
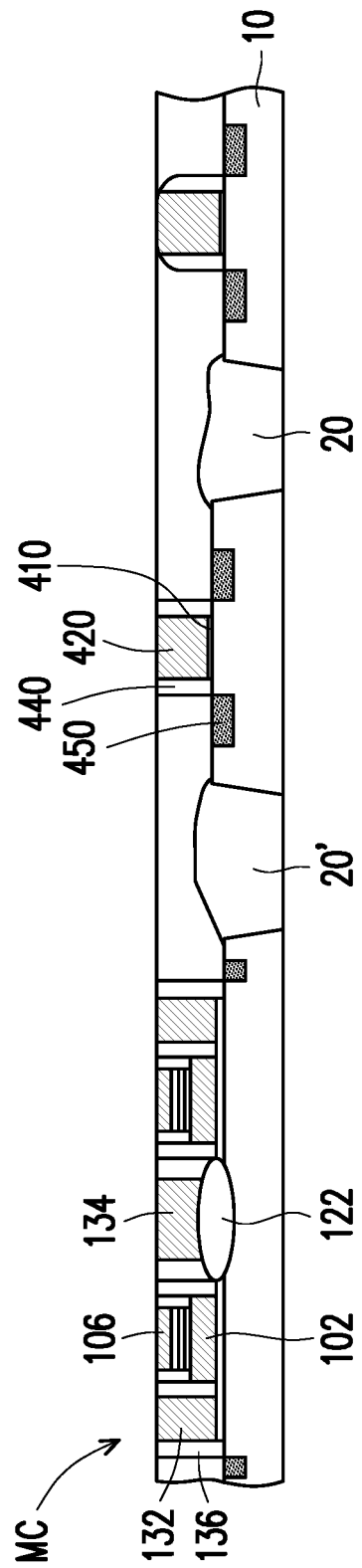
FIG. 29 shows a cross sectional view illustrating one of various stages of forming a transistor structure for the circuit areas according to embodiments of the present disclosure.

Then, the cover layer 200 in the NVM cell area NVM is removed as shown in FIG. 26. Further, sidewall spacers 440 for the FETs in the peripheral logic circuit areas and sidewall spacers 136 are formed for the NVM cell MC. Next, as shown in FIG. 27, silicide layers 450 are formed in the source/drain regions for the FETs in the peripheral logic circuit areas and in the NVM cell area NVM. Then, the mask layers 430 in the peripheral logic circuit areas and the mask layers (e.g., second insulating layer 108) in the NVM cell area NVM, are removed, as shown in FIG. 28. Subsequently, the ILD layer 30 is formed, and a CMP operation is performed to expose the dummy polysilicon layers in the peripheral logic circuit areas and the polysilicon layers for the select gates, control gates and erase gates in the NVM cell area NVM, as shown in FIG. 29. Subsequently, these polysilicon layers are removed, and one or more conductive metal layers are formed as metal gates.

The metal gate includes one or more layers of metal material, such as Al, Cu, W, Ti, Ta, TiN, TiAl, TiAlC, TiAlN, TaN, NiSi, CoSi, other conductive materials. In some embodiments, one or more work function adjustment layers are interposed between the gate dielectric layer and the metal material. The work function adjustment layers are made of a conductive material such as a single layer of TiN, TaN, TaAlC, TiC, TaC, Co, Al, TiAl, HfTi, TiSi, TaSi or TiAlC, or a multilayer of two or more of these materials. For the n-channel FET, one or more of TaN, TaAlC, TiN, TiC, Co, TiAl, HfTi, TiSi and TaSi is used as the work function adjustment layer, and for the p-channel FET, one or more of TiAlC, Al, TiAl, TaN, TaAlC, TiN, TiC and Co is used as the work function adjustment layer.

Figure 30:
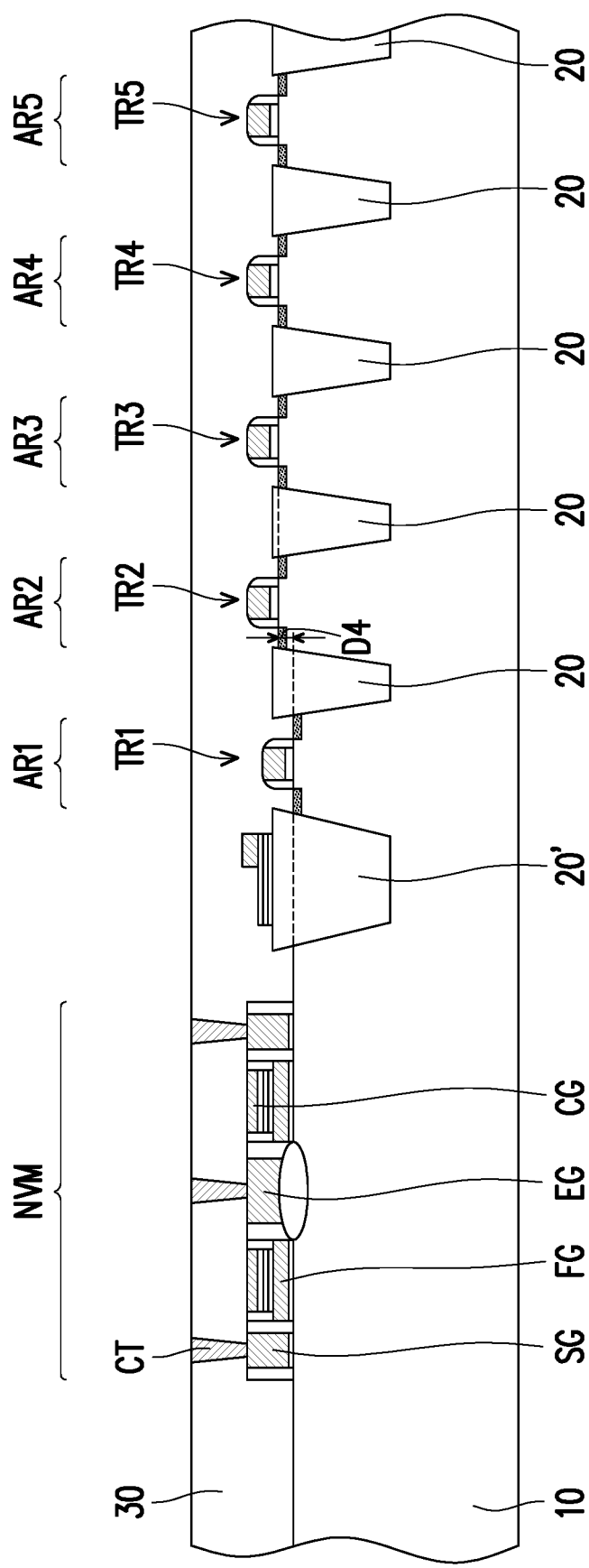
FIG. 30 shows a cross sectional view of a semiconductor device including a non-volatile memory (NVM) area and circuit areas of various operation voltages according to other embodiments of the present disclosure.

FIG. 30 shows a cross sectional view of a semiconductor device including a non-volatile memory (NVM) area and circuit areas of various operation voltages according to other embodiments of the present disclosure.

In FIG. 30, the first area AR1 is disposed to have the same surface level as the NVM cells. In other words, the HV circuits in the first area AR1 are formed in the left side of the boundary BL shown in FIG. 2D and D1 is equal to zero in FIG. 30. In such a case, the step corresponding to D2 may be formed for the second area AR2 instead of the first area AR1.

The step height D4 between the NVM cell area NVM/the first area AR1 and the second to fifth areas AR2-AR5 is in a range from about 15 nm to about 150 nm in some embodiments. In other embodiments, D4 is in a range from about 25 nm to about 80 nm.

Further, the first to fifth areas AR1-AR5 having different operational voltages are disposed in the decreasing order of the voltages from the NVM cell areas. In other embodiments, the highest operational voltage area AR1 is located next to the NVM cell areas with one or more areas for lower operational voltages interposed therebetween.

The various embodiments or examples described herein offer several advantages over the existing art. A logic circuit area having FETs requires a thick gate dielectric layer, which may affect subsequent planarization operations. However, in the present disclosure, the surface of the substrate for the high-voltage area is recessed, which can reduce the height difference caused by the thick gate dielectric layer.

It will be understood that not all advantages have been necessarily discussed herein, no particular advantage is required for all embodiments or examples, and other embodiments or examples may offer different advantages.

In accordance with one aspect of the present disclosure, a semiconductor device includes a non-volatile memory cell formed in a memory cell area of a substrate, a first circuit formed in a first circuit area of the substrate, and a second circuit formed in a second circuit area of the substrate. A first device forming surface of the substrate in the first circuit area is located at a lower level than a second device forming surface of the substrate in the second circuit area as viewed in the cross section.

In accordance with another aspect of the present disclosure, in a method for manufacturing a semiconductor device, a memory cell structure covered by a protective layer is formed in a memory cell area of a substrate. A mask pattern is formed. The mask pattern has an opening over a first circuit area, while the memory cell area and a second circuit area are covered by the mask pattern. The substrate in the first circuit area is recessed, while the memory cell area and the second circuit area are protected. A first field effect transistor (FET) having a first gate dielectric layer is formed in the first circuit area over the recessed substrate and a second FET having a second gate dielectric layer is formed in the second circuit area over the substrate.

In accordance with another aspect of the present disclosure, in a method for manufacturing a semiconductor device, a memory cell structure covered by a protective layer is formed in a memory cell area of a substrate. A recess is formed in a first circuit area, while the memory cell area and a second to a fifth circuit areas are protected. While the memory cell area is protected, a first gate dielectric layer having a thickness T1 is formed in the first circuit area over the recessed substrate, a second gate dielectric layer having a thickness T2 is formed in the second circuit area over the substrate, a third gate dielectric layer having a thickness T3 is formed in the third circuit area over the substrate, a fourth gate dielectric layer having a thickness T4 is formed in the fourth circuit area over the substrate, and a fifth gate dielectric layer having a thickness T5 is formed in the fifth circuit area over the substrate. T1>T2>T3>T4>T5 is satisfied.

The foregoing outlines features of several embodiments or examples so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments or examples introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method of manufacturing a semiconductor device, the method comprising:
    forming a memory cell structure in a memory cell area of a substrate, the memory cell structure including a floating gate electrode;
    forming a protective layer over the memory cell structure to cover the memory cell structure;
    after the protective layer is formed, forming a mask pattern, the mask pattern having an opening over a first circuit area, while the memory cell area and a second circuit area are covered by the mask pattern;
    recessing the substrate in the first circuit area, while the memory cell area and the second circuit area are protected; and
    forming a first field effect transistor (FET) having a first gate dielectric layer in the first circuit area over the recessed substrate and a second FET having a second gate dielectric layer in the second circuit area over the substrate.

2. The method of claim 1, wherein a thickness of the first gate dielectric layer is greater than a thickness of the second gate dielectric layer.

3. The method of claim 1, wherein the recessing the substrate includes:
 forming a oxidation layer by wet oxidation; and
 removing the oxidation layer by wet etching.

4. The method of claim 1, wherein the recessing the substrate includes etching the substrate by dry etching.

5. The method of claim 1, further comprising, before forming the mask pattern:
 forming a first insulating layer;
 forming a second insulating layer over the first insulating layer; and
 forming a third insulating layer over the second insulating layer,
 wherein the mask pattern is a resist pattern.

6. The method of claim 1, further comprising, before forming the memory cell structure, recessing the substrate in the memory cell area.

7. A method of manufacturing a semiconductor device, the method comprising:
 forming a memory cell structure in a memory cell area of a substrate, the memory cell structure including a floating gate electrode;
 forming a protective layer over the memory cell structure to cover the memory cell structure;
 after the protective layer is formed, forming a recess in a first circuit area, while the memory cell area and a second to a fifth circuits areas are protected; and
 while the memory cell area is protected, forming a first gate dielectric layer having a thickness T1 in the first circuit area over the recessed substrate, a second gate dielectric layer having a thickness T2 in the second circuit area over the substrate, a third gate dielectric layer having a thickness T3 in the third circuit area over the substrate, a fourth gate dielectric layer having a thickness T4 in the fourth circuit area over the substrate, and a fifth gate dielectric layer having a thickness T5 in the fifth circuit area over the substrate,
 wherein T1>T2>T3>T4>T5 is satisfied.

8. The method of claim 7, wherein the first to fifth gate dielectric layer are formed by:
 forming a first dielectric layer in the first to fifth circuit areas;
 forming a second dielectric layer over the first dielectric layer;
 exposing the substrate in the second circuit area, while protecting the first and third to fifth circuit areas, and forming a third dielectric layer over the exposed substrate in the second circuit area;
 exposing the substrate in the third circuit area, while protecting the first, second, fourth and fifth circuit areas, and forming a fourth dielectric layer over the exposed substrate in the third circuit area;
 exposing the substrate in the fourth circuit area, while protecting the first to third and fifth circuit areas, and forming a fifth dielectric layer over the exposed substrate in the fourth circuit area; and
 exposing the substrate in the fifth circuit area, while protecting the first to fourth circuit areas, and forming a sixth dielectric layer over the exposed substrate in the fifth circuit area.

9. The method of claim 7, further comprising, before forming the memory cell structure, recessing the substrate in the memory cell area.

10. A method of manufacturing a semiconductor device, comprising:
 forming a first dielectric layer in first to fifth circuit areas;
 forming a second dielectric layer over the first dielectric layer;
 exposing a substrate in the second circuit area, while protecting the first and third to fifth circuit areas;
 forming a third dielectric layer over the exposed substrate in the second circuit area and over the second dielectric layer in the first and third to fifth circuit area;
 exposing the substrate in the third circuit area, while protecting the first, second, fourth and fifth circuit areas;
 forming a fourth dielectric layer over the exposed substrate in the third circuit area, and over the third dielectric layer in the first, second, fourth and fifth circuit areas;
 exposing the substrate in the fourth circuit area, while protecting the first to third and fifth circuit areas, and forming a fifth dielectric layer over the exposed substrate in the fourth circuit area;
 exposing the substrate in the fifth circuit area, while protecting the first to fourth circuit areas; and
 forming a sixth dielectric layer over the exposed substrate in the fifth circuit area and over the fifth dielectric layer in the first to fourth circuit areas.

11. The method of claim 7, wherein the first gate dielectric layer is made of silicon oxide.

12. The method of claim 11, wherein the second gate dielectric layer is made of one of silicon oxynitride, hafnium oxide or zinc oxide.

13. The method of claim 12 wherein the third gate dielectric layer is made of one of silicon oxide.

14. The method of claim 11, wherein the fourth gate dielectric layer is made of one of silicon oxide.

15. The method of claim 11, wherein the fifth gate dielectric layer is made of one of silicon oxide.

16. The method of claim 11, wherein the sixth gate dielectric layer is made of a high-k dielectric material.

17. The method of claim 10, further comprising, before the first dielectric layer is formed, recessing the substrate in the first circuit area so that an upper surface of the substrate in the first circuit area is lower than an upper surface of the substrate in the second to fifth circuit areas.

18. The method of claim 10, further comprising, before the first dielectric layer is formed, forming isolation insulating layers to separate the first to fifth circuit areas from each other.

19. The method of claim 10, wherein a total thickness of the first to sixth dielectric layers in the first circuit area is in a range from 25 nm to 60 nm.

20. The method of claim 19, wherein a thickness of the sixth dielectric layer in the fifth circuit area is in a range from 1 nm to 2 nm.

* * * * *